United States Patent [19]
Akiyama et al.

[11] Patent Number: 6,152,071
[45] Date of Patent: Nov. 28, 2000

[54] HIGH-FREQUENCY INTRODUCING MEANS, PLASMA TREATMENT APPARATUS, AND PLASMA TREATMENT METHOD

[75] Inventors: Kazuyoshi Akiyama, Nara; Atsushi Yamagami, Kawasaki; Satoshi Takaki, Komae; Koji Teranishi, Yokohama, all of Japan

[73] Assignee: Canon Kabushiki Kaisha, Tokyo, Japan

[21] Appl. No.: 08/988,137

[22] Filed: Dec. 10, 1997

[30]    Foreign Application Priority Data

Dec. 11, 1996  [JP]  Japan ................................. 8-352018
Oct. 28, 1997  [JP]  Japan ................................. 9-311337

[51] Int. Cl.$^7$ ................................................. C23C 16/00
[52] U.S. Cl. ........................... 118/723 VE; 118/723 AN; 118/723 E; 118/723 MP; 118/723 MW; 156/345 C; 156/345 P; 156/345 PW; 204/298.38
[58] Field of Search ...................... 118/723 VE, 723 MP, 118/723 E, 723 AN, 723 MW; 156/345 P, 345 C, 345 PW; 204/298.38

[56]              References Cited
U.S. PATENT DOCUMENTS 5,540,781   7/1996  Yamagami et al. ................... 118/723 E
5,902,405   5/1999  Ueda ..................................... 118/723 E

FOREIGN PATENT DOCUMENTS 54086341   7/1979   Japan .
60186849   9/1985   Japan .

OTHER PUBLICATIONS

H. Curtins, et al., "Influence of Plasma Excitation Frequency for a–Si:H Thin Film Deposition", *Plasma Chemistry and Plasma Processing*, vol. 7, p. 267–73 (1987).

*Primary Examiner*—Nasser Ahmad
*Attorney, Agent, or Firm*—Fitzpatrick, Cella, Harper & Scinto

[57]              ABSTRACT

A high frequency introducing means is provided which comprises a high frequency electrode having a shape of a bar or plate for generating plasma by high frequency power, and an adjustment mechanism for adjusting an absolute value of reactance between an end of the electrode opposite to a high frequency power introducing point of the electrode and a grounded portion. A plasma treatment apparatus and a plasma treatment method are also provided employing the above high frequency introducing means. A deposition film of high quality is formed stably and efficiently in an extremely uniform thickness and an extremely uniform quality at a high speed on a base member of a large area by adjusting the absolute value of the reactance.

39 Claims, 18 Drawing Sheets

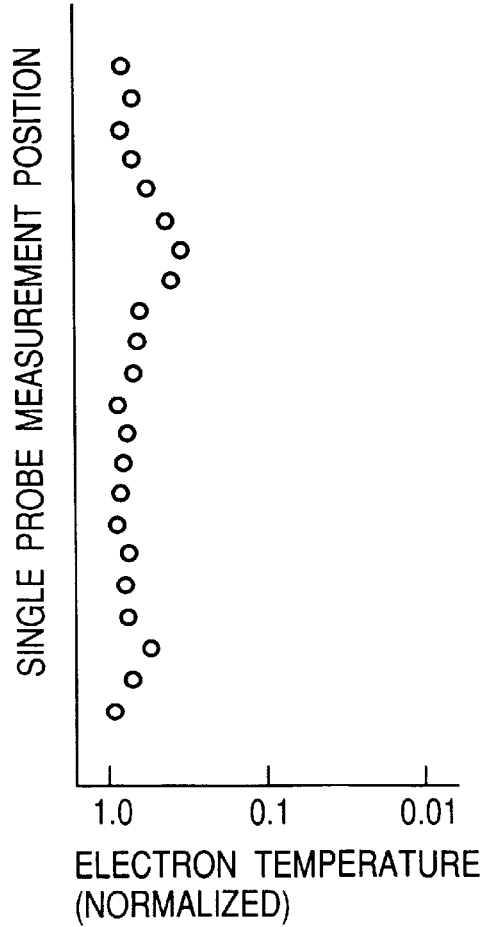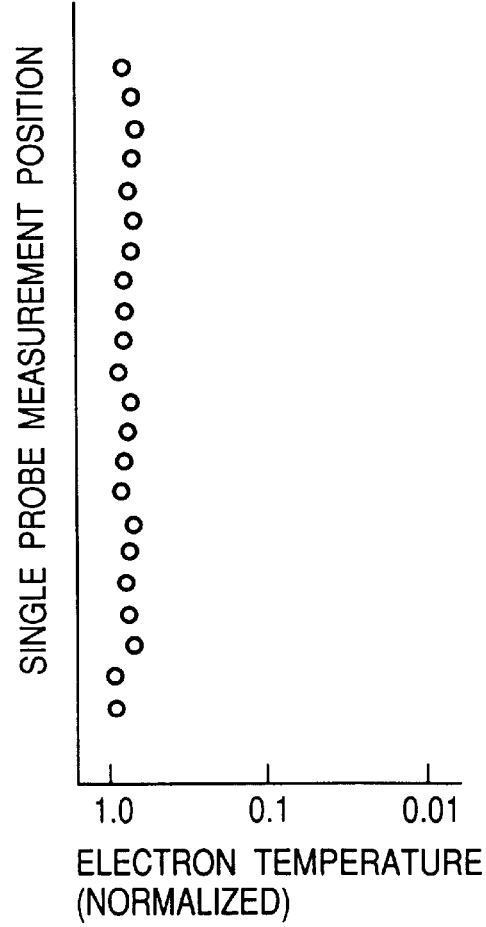

HIGH-FREQUENCY INTRODUCING MEANS, PLASMA TREATMENT APPARATUS, AND PLASMA TREATMENT METHOD

BACKGROUND OF THE INVENTION

1. Field of the Invention

The present invention relates to a high-frequency introducing means for generation of plasma for production of semiconductor devices, electrophotographic photosensitive member devices, image input line sensors, flat panel displays, image pickup devices, photovoltaic devices, and the like. The present invention also relates to a plasma treatment apparatus and a plasma treatment method employing the high frequency introducing means.

2. Related Background Art

Application of plasma for film formation or etching is known in semiconductor device production processes or other processes. For example, plasma CVD apparatuses and plasma CVD methods are used industrially. In particular, the plasma CVD apparatuses employing high frequency of 13.56 MHz or employing microwave of 2.45 GHz are widely used since the apparatuses are capable of treating base members and deposition films whether the material is electroconductive or insulating.

As a conventional example, a parallel plate type high frequency electrode for plasma generation and a plasma CVD apparatus employing the high frequency electrodes are explained schematically referring to FIG. 1. In a reaction chamber 101, a high frequency electrode 103 is held by a high frequency electrode holder 103 made of an insulating material. The high frequency electrode 103 is a flat plate placed parallel to a counter electrode 105. Plasma is generated between the electrodes by an electric field depending on the capacitance therebetween. The generated plasma which is substantially a dielectric forms a sheath between the electrodes the sheath acts chiefly as a condenser equivalent between the plasma and the electrodes or the reaction chamber wall, and in many cases an impedance at this time greatly differs from the impedance before plasma generation. A ground shield 104 is provided around the high frequency electrode 103 to prevent electric discharge between the lateral side of the high frequency electrode 103 and the reaction chamber 101. To the high frequency electrode 103, a high frequency power source 111 is connected through a matching circuit and a high frequency power supplying line 110. On the counter electrode 105 placed parallel to the high frequency electrode, a base member 106 having a flat plate shape is placed. The base member 106 is kept at a desired temperature by a temperature controller (not shown in the drawing).

By using this apparatus, plasma CVD is conducted as described below. The reaction chamber 101 is evacuated to a high vacuum by an evacuation means 107. Then a reaction gas is introduced into the reaction chamber 101 from a gas-supplying means 108, and the gas pressure is kept at a predetermined pressure. High frequency power is applied from the high frequency power source 111 to the high frequency electrode 103 to generate plasma between the high frequency electrode and the counter electrode. Thereby, the reaction gas is decomposed and excited by the plasma to form a deposition film on the base member 106. The frequency of the high frequency power is usually 13.56 MHz. At the frequency of 13.56 MHz, there is a low utilization efficiency of the gas and a relatively low rate of deposited film formation although the discharge conditions can be relatively easily controlled and the formed film has high quality. In view of the above problems, use of higher frequency ranging from about 25 to about 150 MHz has been investigated for the plasma CVD. For example, Plasma Chemistry and Plasma Processing, Vol.7. No.3, (1987) pp.267–273 describes formation of an amorphous silicon (hereinafter referred to as "a-Si") film by decomposing a source gas (silane gas) by high frequency power of 25–150 MHz by means of a parallel plate type glow discharge decomposition apparatus. According to the description, specifically, in formation of an a-Si film by using a frequency selected from the range from 25 to 150 MHz, the film deposition rate by using 70 MHz reaches the maximum of 2.1 nm/sec, which is 5 to 8 times as large as that in the aforementioned plasma CVD at 13.56 MHz. The excitation frequency hardly affects the defect density, the optical bandgap, and the electroconductivity of the obtained a-Si film. The apparatus shown in FIG. 1 is an example of a plasma CVD apparatus suitable for forming a deposition film on a flat plate-shaped base member.

On the other hand, Japanese Patent Application Laid-Open No. 60-186849 discloses an example of a plasma CVD apparatus suitable for film deposition on a plurality of cylindrical base members. It discloses a plasma CVD apparatus employing a microwave energy source of frequency of 2.45 GHz and another plasma CVD system employing a radio frequency energy (high frequency power) source. The RF plasma CVD apparatus employing the radio frequency power source is explained referring to drawings. FIGS. 2A and 2B are schematic sectional views showing the structure based on the RF plasma CVD system described in the above patent application. FIG. 2B is a sectional view taken along the line 2B—2B of FIG. 2A.

In FIG. 2A and FIG. 2B, in the reaction chamber 200, six base member holders 205A are placed concentrically at predetermined space intervals. A cylindrical base member 206 for use in film formation is held by the respective base member holders 205A. In the inside of the respective holders 205A, a heater 240 is provided to heat the cylindrical base member 206 from the inside. The holders 205A are connected respectively to a shaft 231 linked to a motor 232 to be rotated. The cylindrical base members 206 are held also by auxiliary holding members 205B. A high frequency electrode 203 of an antenna type is placed at the center of the plasma generation region, and is connected through a matching circuit 209 to a high frequency power source 211. A high frequency electrode supporting member 230 supports the high frequency electrode. An evacuation pipe 207 having an evacuation valve is communicated to an evacuation mechanism 235 equipped with a vacuum pump. A source gas supplying system 208, which is constituted of gas bombs, mass flow controllers, valves, and so forth, is connected through a gas feeding pipe 217 to gas releasing pipes 216 having a plurality of gas releasing holes. The numeral 233 indicates sealing members.

By using this system, the plasma CVD is conducted, for example, as described below. The reaction chamber 200 is evacuated to a high vacuum by an evacuation mechanism 235. Then a reaction gas is introduced into the reaction chamber 200 from a gas-supplying means 208 through the gas feeding pipe 217 and gas release pipes 16, and the gas pressure is kept at a predetermined pressure level. High frequency power is supplied from a high frequency power source 211 through a matching circuit 209 to the high frequency electrode 203 to generate plasma between the high frequency electrode and the cylindrical base members 206. Thereby the reaction gas is decomposed and excited by the plasma to form a deposition film on the cylindrical base members 206. The plasma CVD apparatus shown in FIGS. 2A and 2B is advantageous in that the gas utilization efficiency is high since the electric discharge space is surrounded by the cylindrical base members.

The aforementioned film formation by using the parallel plate type apparatus at a high frequency power of 25–150 MHz was conducted in a laboratory scale. The applicability in large-area film formation is not mentioned at all. Generally, at a higher excitation frequency, the influence of the standing wave on the high frequency electrode becomes more significant, and in particular when flat plate electrodes are used, complicated two-dimensional standing waves occur, which can make the formation of a uniform large-area film difficult.

When the apparatus shown in FIGS. 2A and 2B is used for formation of deposition film over the entire surface of the cylindrical base members, it is necessary to rotate the cylindrical members. The rotation of the base member causes a drop in the deposition rate to about ⅓ to ⅕ of that of the parallel plate type plasma CVD system. More specifically, in the above apparatus, the deposition film is formed on the cylindrical base members at the position facing the high frequency electrode at the same rate as in the parallel plate type plasma CVD apparatus, whereas at the portion not facing the discharge space, little deposition film formation proceeds. In the above patent application, the frequency of the high frequency power is not mentioned specifically. The inventors of the present application conducted deposition of an amorphous silicon film on the entire surface of a cylindrical base member using the plasma CVD apparatus having a constitution as shown in FIGS. 2A and 2B by rotating the cylindrical base members using $SiH_4$ as the source gas at a usual high frequency power of 13.56 MHz, and at a pressure of several hundred mTorr where the deposition rate is high but a powdery matter such as polysilane tends to be produced. As a result, the substantial deposition rate was 0.5 nm/s or lower. In production of an electrophotographic photosensitive member having an amorphous silicon layer as a photosensitive layer, the thickness of the photosensitive layer is required to be 30 $\mu$m or more. By using the plasma CVD apparatus shown in FIGS. 2A and 2B, at the deposition rate of 0.5 nm/s, the film formation takes as long as 16 hours or more, resulting in poor productivity. In this system also, at a high frequency power of 30 MHz or higher, although the plasma density becomes larger resulting in a larger deposition rate, there is a problem that plasma generation tends to be nonuniform owing to the influence of the standing wave to make extremely difficult the formation of a uniform deposition film on the base member.

In any of the systems using the apparatuses shown in FIG. 1, and FIGS. 2A and 2B, at a frequency power higher than 30 MHz, the plasma density rises to increase the radical generation density and to raise the deposition rate, but the reaction between the radicals is also accelerated to form polysilane which impairs the quality of the deposition film. Although a lower pressure at film formation is effective to retard the formation of polysilane at high radical density, it is difficult to generate and maintain the plasma. In particular, since the impedance after the plasma generation greatly differs from the impedance before the plasma generation, there is a problem that the discharge is interrupted owing to small change of the plasma state and the like by matching to the high frequency.

On the other hand, in the technical field of image formation, the photoconductive material for forming a light-receiving layer of the photosensitive member is required to have a high sensitivity, a high SN ratio (photo current (Ip)/dark current (Id)), absorption spectrum characteristics matching to the spectrum characteristics of the irradiated electromagnetic wave, quick optical response, desirable dark resistance, harmlessness to human bodies in use, and so forth. The harmlessness to human body is particularly important for the electrophotographic photosensitive members built in electrophotographic apparatuses used in offices as a business machine in consideration of direct or indirect contact with human bodies.

An electrophotographic photosensitive member satisfying the above requirements is the one employing amorphous silicon (a-Si). For example, Japanese Patent Application Laid-Open No. 54-86341 discloses a technique regarding an electrophotographic photosensitive member employing a-Si in the photoconductive layer and being excellent in humidity resistance, durability, and electric properties. By using such techniques, the electrophotographic photosensitive member constituted of a-Si has become commercially practical, being improved in electrical, optical, and photoconductive characteristics, use environmental characteristics, and durability, and being capable of improving image quality.

The production of a-Si photosensitive member requires a high level of techniques. In particular, for the electrophotographic photosensitive member, a larger area and a larger thickness of the layer are necessary, so that the uniformity of film formation is an important factor. Therefore, various techniques have been proposed for stable industrial production of high quality a-Si photosensitive member. For example, Japanese Patent Application Laid-Open No. 6-342764 (USP 5540781) discloses an apparatus in which a cathode electrode is divided into several pieces in the direction of the cylindrical base member and high frequency power is applied to the respective cathode pieces to obtain a uniform high-quality deposition film. By using such techniques, the photosensitive member can be obtained stably without variation of the characteristics.

In recent years, however, the electrophotographic apparatuses are required to achieve still higher image quality, still higher speed, and still higher durability. Furthermore, miniaturization of the photosensitive member as well as of the main body of electrophotographic apparatus has become urgently necessary for meeting the needs for space efficiency. Such requirements cannot readily be satisfied by the apparatus constitution disclosed in the above Japanese Patent Application Laid-Open No. 6-342764.

For example, a constitution comprising a cathode of a larger diameter and a plurality of base member placed in the chamber will cause unnecessary increase of the electrode area and may cause difficulty in keeping the uniformity of the electric discharge.

In a constitution in which a plurality of base members are placed around the center cathode electrode, it is often difficult in apparatus constitution to divide the cathode in the axis direction in several pieces and to apply high frequency power to the respective cathode pieces.

Furthermore, the reproducibility of half tone of the image is becoming more important because reproduction of high fine image having high gradation is demanded.

Under such circumstances, high-speed image formation using a smaller-sized photosensitive member makes prominent uneven photosensitivity and uneven image density which do not become problems in the prior art, thereby resulting in density unevenness of half-tone image to impair image quality and resulting in coarseness on a half-tone image appearing such that fine particles are scattered. Thus more uniform photosensitive member is required to solve the above problems.

In such a situation, an apparatus is demanded which is capable of producing a photosensitive member with more excellent uniformity with higher productivity.

SUMMARY OF THE INVENTION

An object of the present invention is to solve the above problems and to provide a high frequency introducing means for use in plasma generation suitable for forming stably a deposition film having an extremely uniform thickness and extremely high quality on a base member of a large area at a high rate to effectively produce a semiconductor device, and to provide a plasma treatment apparatus comprising the high frequency introducing means and a plasma treatment method.

Another object of the present invention is to provide an apparatus and a method for forming an amorphous silicon type photosensitive member, which are capable of producing the photosensitive member of high quality at a high efficiency and at low cost by uniformizing the radiation of high frequency power and preventing uneven distribution of plasma without the above-mentioned problems, in particular to provide a plasma treatment apparatus and a plasma method of forming an image having excellent uniformity and fineness in half tone.

Still another object of the present invention is to provide a high frequency power introducing means comprising a high frequency electrode having a bar-like or plate-like shape for generating plasma by high frequency power, and an adjustment mechanism for adjusting an absolute value of reactance between an end of the electrode opposite to a power introducing point of the electrode and a grounded portion.

A further object of the present invention is to provide a plasma treatment apparatus comprising a vacuum-tight reaction chamber, a gas-feeding means for feeding a gas to the reaction chamber, a high frequency electrode and a high frequency power source for supplying high frequency power to the reaction chamber, a base member holding means provided in the reaction chamber, and an evacuating means for evacuating a gas within the reaction chamber after reaction, in which a high frequency power generated at the high frequency power source is supplied to the high frequency electrode to generate plasma between the base member held by the base member holding means and the high frequency electrode, wherein an adjustment mechanism is provided for adjusting an absolute value of reactance between an end portion of the electrode opposite to a power introducing point of the electrode and a grounded portion.

A still further object of the present invention is to provide a plasma treatment apparatus comprising an vacuum-tight reaction chamber, and at least a gas introducing means for introducing a gas into the reaction chamber, and a high frequency power introducing means provided parallel to a generatrix line of a cylindrical base member in the reaction chamber, in which plasma is generated by causing glow discharge between the high frequency power introducing means and the base member, wherein the high frequency power introducing means comprises means for adjusting capacitance at an end portion of the high frequency power introducing means.

A still further object of the present invention is to provide a plasma treatment method comprising the steps of introducing a gas into a vacuum-tight reaction vessel, and generating a plasma by high frequency power between a base member held by a base member holder and a high frequency electrode placed in the reaction chamber, wherein the plasma is maintained in such a state that the absolute value of reactance between an end of the electrode opposite to a power introducing point of the high frequency electrode and a grounded portion is kept at a predetermined value or less.

A still further object of the present invention is to provide a plasma treating method comprising causing glow discharge between a high frequency power introducing means and the base member to generate plasma in the reaction chamber, wherein capacitance at an end of the high frequency power introducing means is varied.

BRIEF DESCRIPTION OF THE DRAWINGS

FIGS. 16, 18, 19, and 20 are schematic graphs for explaining examples of electron temperature distribution.

DESCRIPTION OF THE PREFERRED EMBODIMENTS

Figure 1:
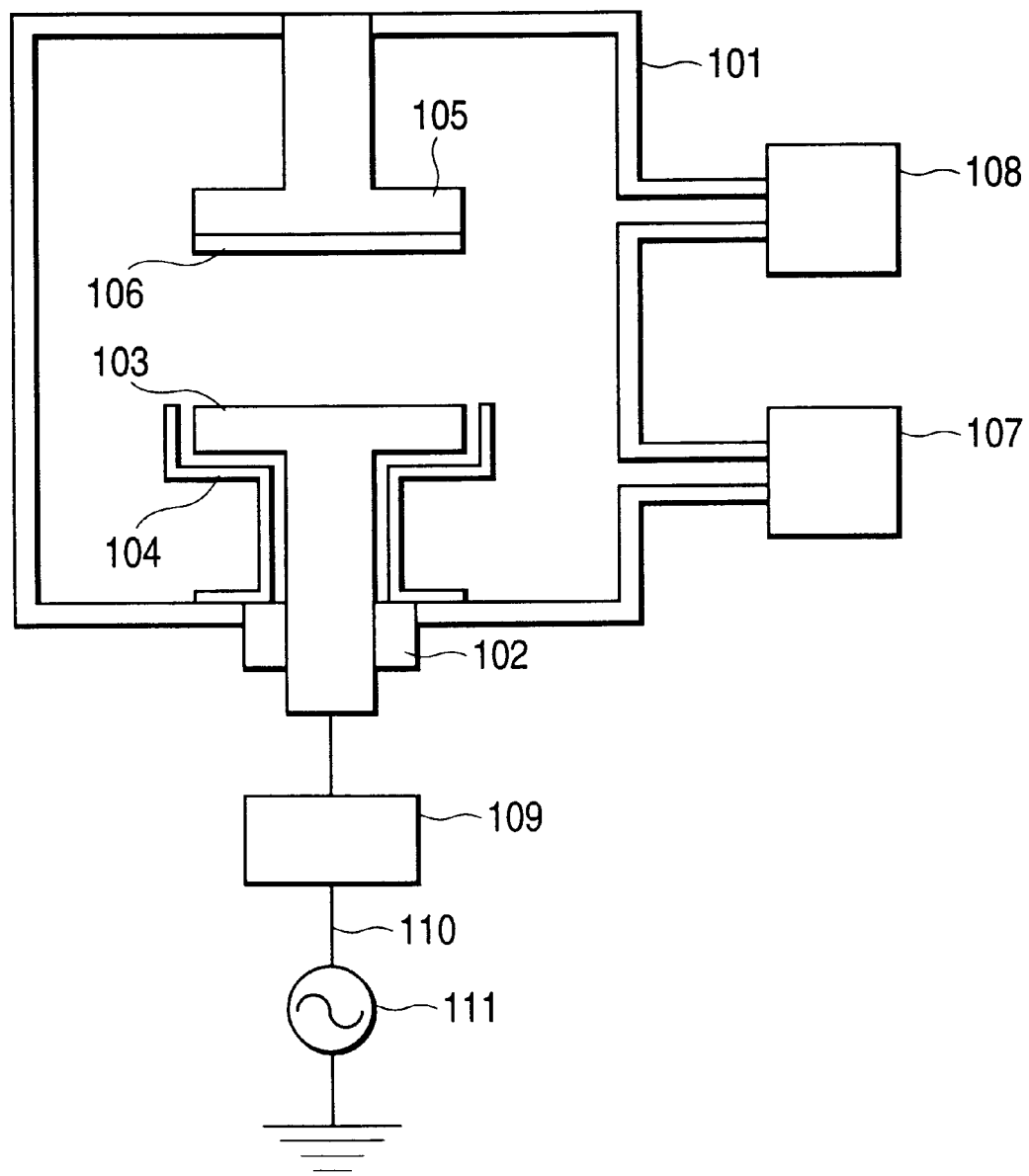
FIG. 1 is a schematic sectional view of an example of a parallel plate type plasma treatment apparatus.

By the present invention, it is possible to make uniform the high frequency power from the high frequency power introducing means, to prevent the nonuniformity of plasma discharge, particularly to make highly uniform the quality and the characteristics of an entire deposition film, e.g., for an electrographic photosensitive member or an entire surface to be treated by plasma, and to provide a product such as a photosensitive member having excellent uniformity and fineness in half tone and the like.

After comprehensive investigation, it was found by the inventors of the present application that the problems of the prior art are mainly caused by uneven distribution of radiation of the high frequency power. According to the findings, on application of high frequency power to a conventional high frequency power introducing means, the high frequency power is reflected repeatedly between the both ends of the high frequency power introducing means (substantially between the both ends of the portion radiating the high frequency power into the plasma). As a result, the high frequency power is weakened at or near the middle portion by interference caused by the multiple reflection of the high frequency power generated on the surface of the high frequency power introducing means, thereby locally resulting in a portion of a weakened high frequency power on the introducing means. This tendency becomes remarkable, for instance, when the frequency of the high frequency wave is raised for increasing the deposition film forming rate. Presumably, by the increase of the frequency, the wavelength of the high frequency wave becomes closer to the practical length of the high frequency power introducing means to make the interference more prominent.

Such unevenness of the high frequency power hardly affects the rate of film deposition on a base member, but causes unevenness of the electron temperature in plasma to affect the characteristics of the formed deposition film, thereby for instance, resulting in a slight difference in photosensitivity.

Such slight difference in characteristics of the deposited film becomes little problem in a photoelectric photosensitive member in conventional electrophotographic processes. However, the slight differences has become a problem in image formation with a trend toward a smaller diameter of the photosensitive member and a higher copying speed, in particular recognized as the problem of nonuniformity of a half tone image.

On the other hand, image coarseness is known to be generated in a nonuniform image density portion. The coarse image, even when it is not detectable by measurement such as reflectometry in comparison with a non-coarse image portion, looks darker to the naked eye. Therefore, slight unevenness of the potential in half tone light exposure can result in significant irregularity of apparent image density of a practical copied image. The detailed mechanism of the image coarsening is not known at present. Presumably it is generated by slightly changing the surface state of the photosensitive member at the portion of weak radiation of the high frequency power and retarding uniform dispersion and adhesion of the toner on the photosensitive member during development.

For preventing unevenness of high frequency power radiation, the electrode should be designed in accordance with the wavelength of the high frequency power. In plasma CVD, however, interaction occurs by reflection and absorption of high frequency power at the interface between the plasma and the electrode or in the sheath region, which makes numerical analysis difficult. Such interaction between the plasma and the high frequency power depends on the plasma discharge intensity, the pressure, and other conditions, which makes more difficult the design of the high frequency power introducing means.

When the apparatus constitution disclosed in Japanese Patent Application Laid-Open No. 6-342764 is employed to solve the above problems, a deposition film of higher performance cannot readily be produced with higher productivity, and the high frequency power introducing means surrounded by and placed in the center position of the electroconductive base members may not be divided suitably as mentioned above.

In the present invention, a capacitance controlling means is provided at both ends of the high frequency power introducing means to change the phase of the power reflected at both ends of the high frequency power introducing means. According to the experiments by the inventors of the present application, the intensity of the standing wave generated on the surface of the high frequency power introducing means can be controlled by changing the capacitances at both ends of the high frequency power introducing means. That is, the position of the node of the standing wave on the high frequency power introducing means and the drop of the high frequency power at the node position can be adjusted thereby. For example, the position of the node can be shifted to a position indifferent to the photosensitive member formation to obtain a photosensitive member having uniform characteristics. The drop of the high frequency power at the position of the n ode can be adjusted to decrease the drop level and thereby generate plasma discharge with substantial uniformity.

Furthermore, the aforementioned problems can be solved by adjusting the absolute value of the reactance between an end portion of the electrode opposite to a high frequency power-introducing point and a grounded portion to be a predetermined value or less in the construction of the electrode to stabilize the discharge. This is based on the findings obtained by the inventors of the present application after comprehensive investigation. According to the findings of the inventors of the present application, at the frequency of the high frequency power of 30 MHz or higher, the discharge can be generated at a high vacuum region where the gas reaction is less readily caused and excellent film properties can be obtained and the deposition rate can be improved in comparison with the deposition rate at 13.56 MHz, but the discharge stability is still not satisfactory at the high vacuum region and the distribution of the film quality and the deposition rate are also not satisfactory, as shown later in Comparative Example 1.

Therefore, the inventors of the present application made studies on the causes of insufficient stability of the discharge in a high vacuum region, local deterioration of the film quality, and drop of the deposition rate at the frequency of the high frequency power of 30 MHz or higher.

Firstly, the inventors of the present application assumed that the instability of the discharge in high vacuum is caused by the extremely large change of the impedance before and after discharge. The voltage for generating and maintaining the discharge in high vacuum is higher than that in relatively simple discharge in low vacuum. Usually the high frequency discharge is glow discharge at constant power, and is maintained by conversion of the power to impedance suitable for the discharge load through a matching circuit. In an extreme case, when a flash of arc discharge occurs, the impedance decreases instantly to cause low-voltage high-current discharge to stop the glow discharge. In this case, excessive impedance change before and after the discharge causes failure of impedance conversion by the matching circuit to keep the interruption of the discharge.

Further, the inventors of the present application made comprehensive investigations to solve the problem of the local formation of low film quality at the power frequency of 30 MHz or higher. Consequently it was found that the impairment of the film quality relates strongly to plasma potential distribution. As the a result of measurement of the plasma potential by the Langmuir probe method along the axis direction of a cylindrical base member, drop of the plasma potential was observed at the site corresponding to the local impairment of the film quality.

From the above results of the investigations, the nonuniformness of film quality distribution and the deposition rate distribution is estimated to be caused by the standing wave produced in the high frequency electrode and the decay of the high frequency power on the high frequency electrode.

Generally, in plasma generation by application of high frequency power between a high frequency electrode and a counter electrode, a nonnegligible standing wave may be generated in the electrode depending on the relation between the frequency of the high frequency power applied to the electrode and the size of the electrode. A standing wave tends to be generated at a higher frequency of the high frequency power or at a larger size of the high frequency electrode. When a standing wave is large, the electric field will become nonuniform in the high frequency electrode, and the plasma distribution between the electrodes such as plasma density, plasma potential and electron temperature distribution becomes nonuniform to impair the quality of a film formed by plasma CVD.

In the above experiments, the standing wave is considered to be generated by interference of a reflection wave generated on the high frequency electrode from the end of the electrode with an incident wave at the frequency of 30 MHz or higher to affect adversely the film quality and the deposition rate. The electric field becomes less intense at the node position of the standing wave, which causes a local drop of the plasma potential to cause local impairment of the film quality. At the higher frequency, high frequency power is more absorbed by the plasma, and decay of the high frequency power becomes larger with increasing the distance from the high frequency power introducting point in the high frequency electrode, thereby affecting adversely the deposition rate distribution. At the frequency of 400–600 MHz, the nodes of the standing waves would be generated at a plurality of positions with the decay of the high frequency power from the power introducting point.

The present invention has been accomplished on the basis of the results of the above investigations.

An embodiment of the present invention is explained referring to the drawings.

Figure 2A:
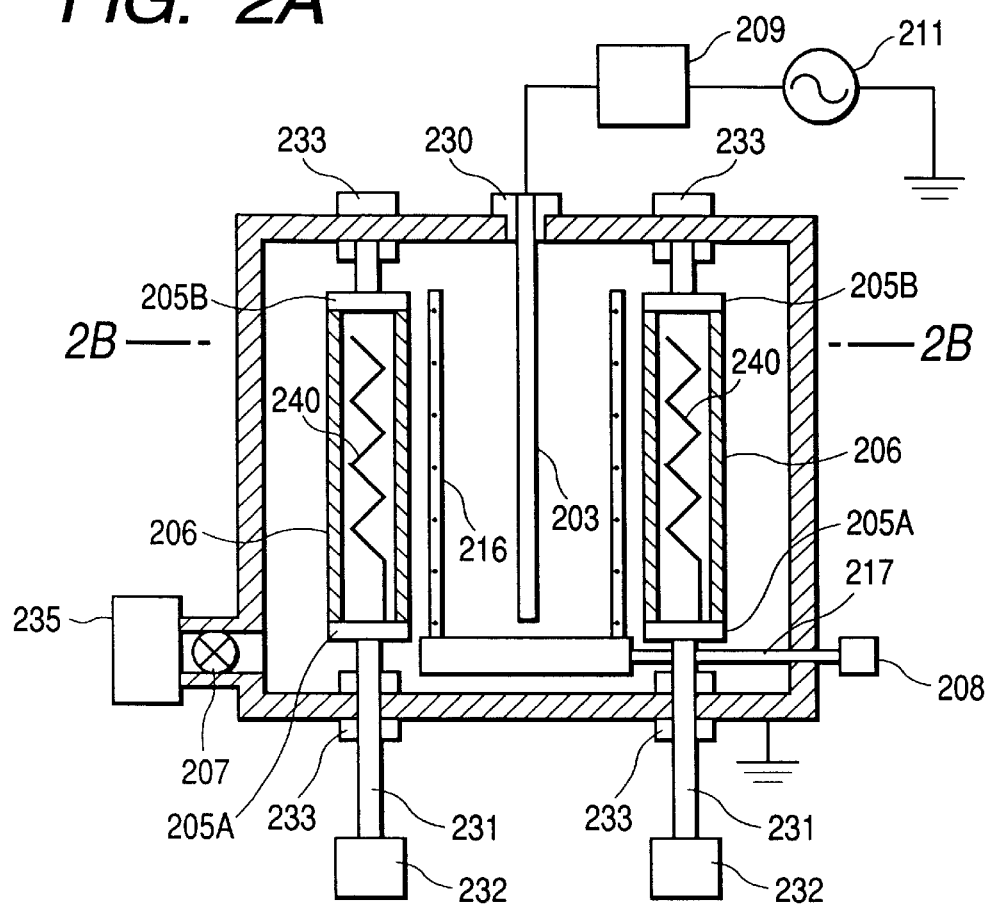
FIGS. 2A and 2B are schematic sectional views of a concentric type plasma treatment apparatus.
Figure 2B:
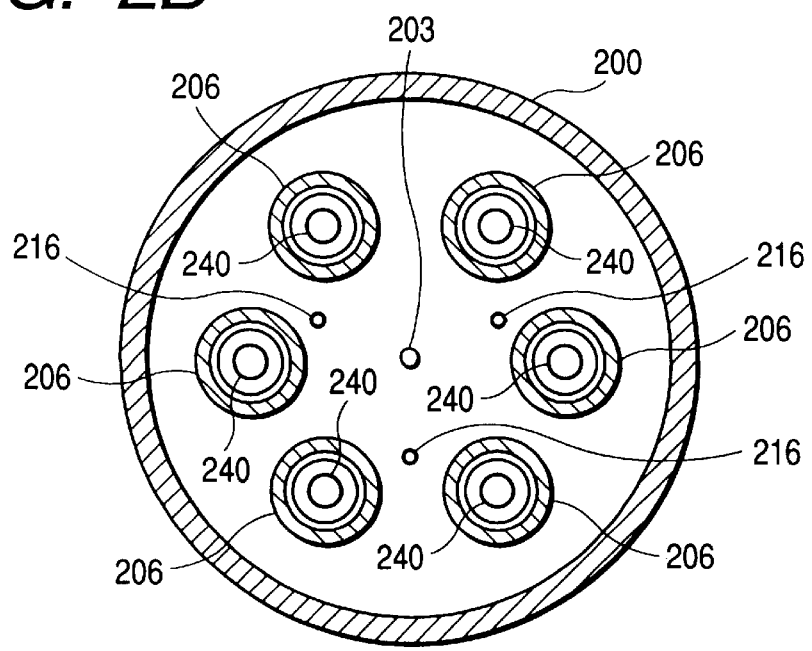
Figure 3A:
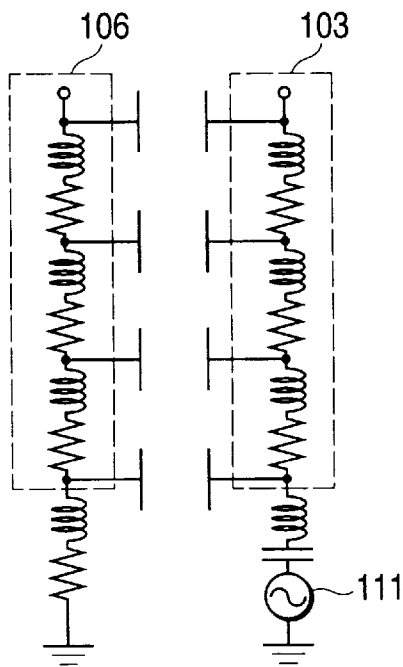
FIGS. 3A, 3B, 3C, and 3D are schematic circuit diagrams for explaining electric constitutions of the high frequency introducing means.
Figure 3B:
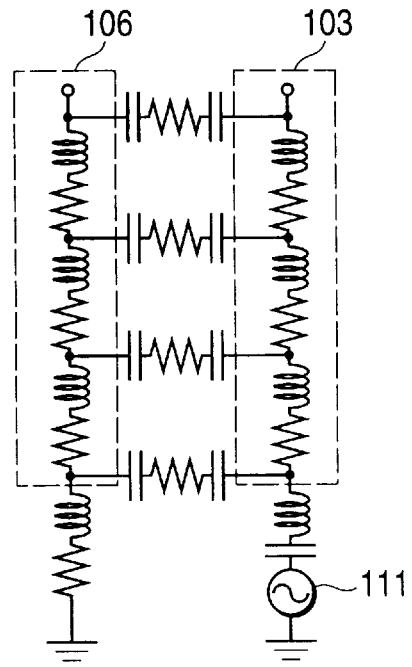

Firstly, the introduction of the high frequency power for plasma generation according to the present invention is described below by reference to FIGS. 3A to 3D. FIG. 3A and FIG. 3B show respectively an equivalent circuit before or after plasma generation with using a high frequency electrode as shown in FIGS. 2A and 2B. The equivalent circuits are shown in a form of a distributed constant circuit because of high frequency of the high frequency power. In FIG. 3A, the high frequency power generated in a high frequency power source 111 is fed through a matching circuit to a high frequency electrode 103. The high frequency electrode 103 is in a simple bar antenna shape, usually being shown as a series impedance of surface resistance (R) and inductance (L). A base member 106 opposite to the high frequency electrode 103 is grounded at an end thereof and has a sufficient inductance, being represented similarly by a series impedance (R+jωL) of surface resistance (R) and inductance (L). When plasma is not generated, a capacitance (C) is formed between the high frequency electrode 103 and the base member 106 depending on the relative position and the shapes thereof. The high frequency current flowing in the high frequency electrode 103 depends on the capacitance (C) between the high frequency electrode 103 and the base member 106, so that the ease of plasma generation is greatly affected by the relative positions between the high frequency electrode 103 and the base member 106, and the shapes thereof. Therefore, even a slight change of the relative positions will necessitate adjustment for optimization. When the plasma is generated, the plasma becomes a conductor having a resistance, and the ion sheaths between the plasma and the high frequency electrode 103 and the base member 106 form the capacitances. This is represented by the equivalent circuit of FIG. 3B. Generally the capacitance is inversely proportional to a distance between conductors when the areas of the conductors and the dielectric constant of a medium are fixed. The ion sheaths have extremely small thicknesses in comparison with the distance between the high frequency electrode and the base member, having a large capacitance. Therefore, the impedance between the high frequency electrode and the base member is greatly changed by plasma generation, which makes adjustment of the matching circuit difficult and retards generation of the plasma. A slight change of the plasma causes great change of the impedance. This change is not compensatable even by use of an automatic matching circuit, whereby the plasma generation is stopped at an extreme case. Moreover, the end of the high frequency electrode is open as shown in the equivalent circuits of FIG. 3B, being liable to cause formation of strong standing waves. When the impedance of the plasma is low in comparison with the impedances of the high frequency electrode and the base member, the high frequency current flows more in the high frequency electrode at the high frequency introduction side in consideration with the distributed constant circuit, and the high frequency current decreases rapidly at a side nearer to the tip of the electrode. From the above two reasons, the plasma generation is liable to be nonuniform.

Figure 3C:
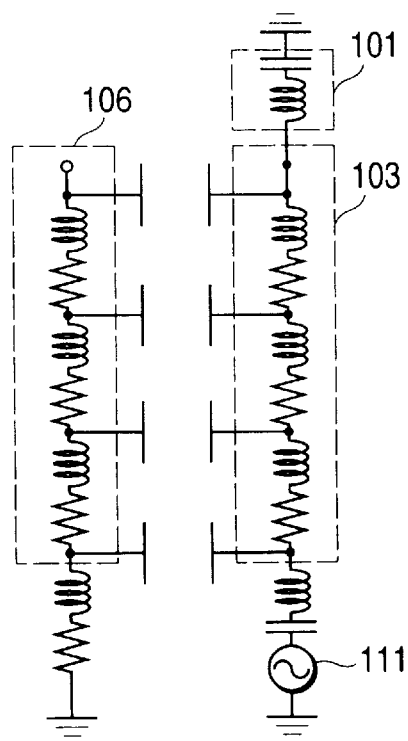
Figure 3D:
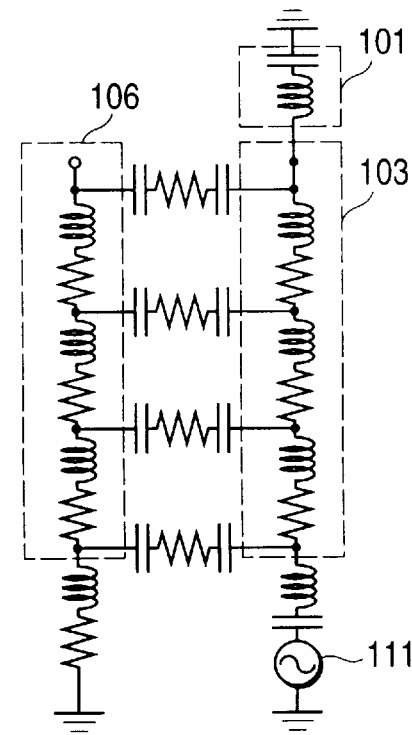

FIG. 3C and FIG. 3D show respectively an equivalent circuit before or after plasma generation by the high frequency electrode of the present invention. In FIG. 3C, the high frequency power generated in a high frequency power source 111 is fed through a matching circuit to a high frequency electrode 103. The high frequency electrode 103 is in a simple bar antenna shape, usually being represented as a series impedance of surface resistance (R) and inductance (L). The high frequency electrode 103 is grounded through an LC circuit 101 at the end of the electrode. When the frequency is high, only C (static condenser) may be provided since the impedance (jωL) naturally becomes larger by the L component. When an impedance of the LC circuit 101 is made sufficiently smaller than that of the impedance caused by the capacitance between the high frequency electrode and the base member, the high frequency current passing through the high frequency electrode 103 is determined by the impedance of the high frequency electrode and the LC circuit 101 at the electrode end, depending little on the relative positions and shapes of the electrode and the base member. Therefore, if the shape of the base member is changed, the ease and stability of the plasma generation is affected little, so that optimization can readily be carried out. In plasma generation, the equivalent circuit is represented by FIG. 3D, similarly to the conventional case. The change of the impedance between before and after the plasma generation is relatively made smaller by decreasing the absolute value of the LC circuit 101 at the electrode end in comparison with the series impedance of the plasma and the ion sheaths to heighten the effect of the impedance of the LC circuit 101 at the electrode end with respect to the high frequency current. Therefore, the change of the matching conditions becomes smaller against the variation of the plasma state to stabilize the plasma. The most portion of the high frequency current flows to the LC circuit at the electrode end to decrease the difference in the high frequency current intensity between the power introduction point and the end of the high frequency electrode 103, thereby improving the uniformity of the plasma. The impedance of the plasma depends on the plasma generation conditions. However, a resistance as the real number portion is in most cases not higher than 50Ω, and a reactance as the imaginary number portion depends on discharge frequency or other conditions.

Accordingly, in the present invention, the absolute value of the reactance between the end portion of the high frequency electrode for plasma generation opposite to the power introducing point of the electrode and the ground portion is preferably not higher than 50Ω at the aforementioned frequency of the high frequency power.

For the plasma generation electrode of the present invention, the reactance between the tip end portion opposite to the power introducting point of the electrode and the ground portion is preferably adjusted by the length of the line and/or the capacitance of the condenser between the tip end portion and ground portion. The frequency of the high frequency power used for the electrode of the present invention is preferably in the range from 30 to 600 MHz.

The surface of plasma generation high frequency electrode is preferably coated with a dielectric substance.

According to the present invention, a deposition film of extremely uniform quality and thickness can be formed by use of the plasma CVD apparatus and the plasma CVD method employing the plasma generation high frequency electrode of the above constitution capable of generating uniform and stable plasma.

This is described below in more detail.

Figure 4A:
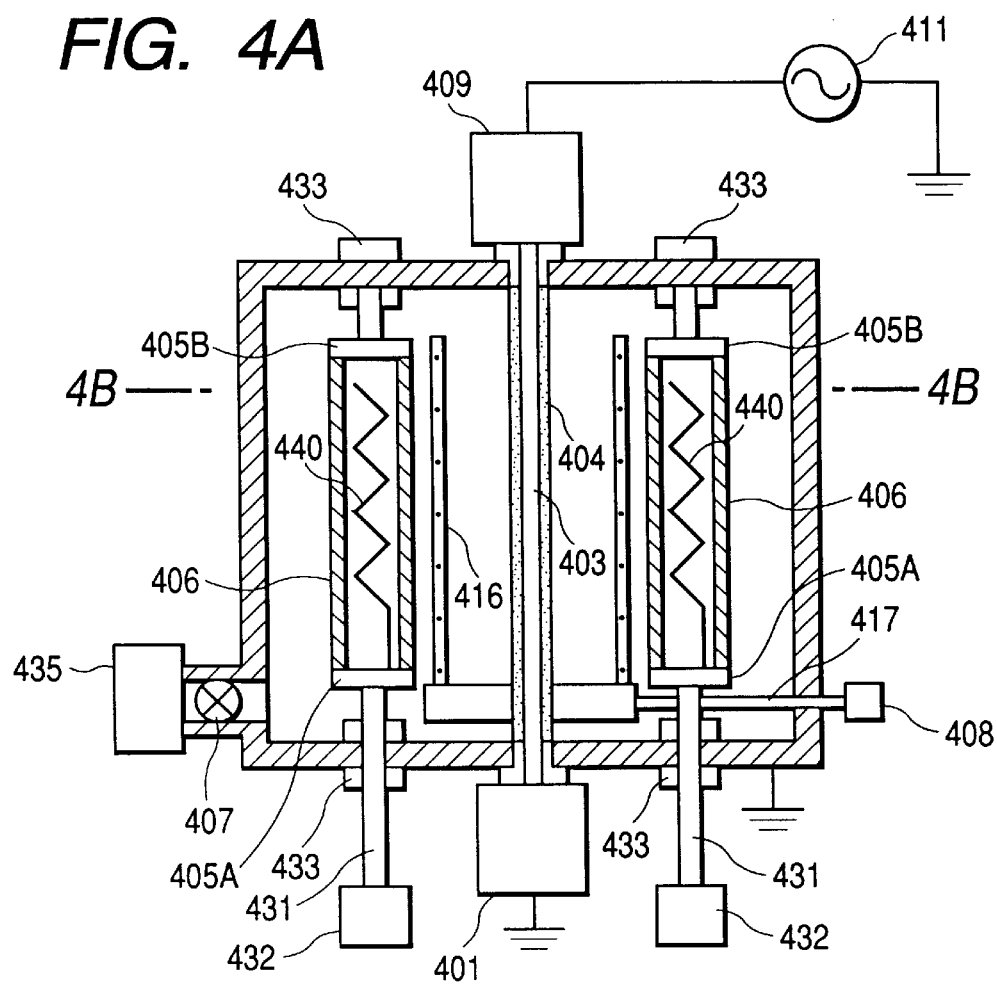
FIGS. 4A, 4B, 5, 6, 7, 8A, 8B, 11A, 11B, 22A, and 22B are schematic sectional views for explaining preferable examples of the plasma treatment apparatus of the present invention.
Figure 4B:
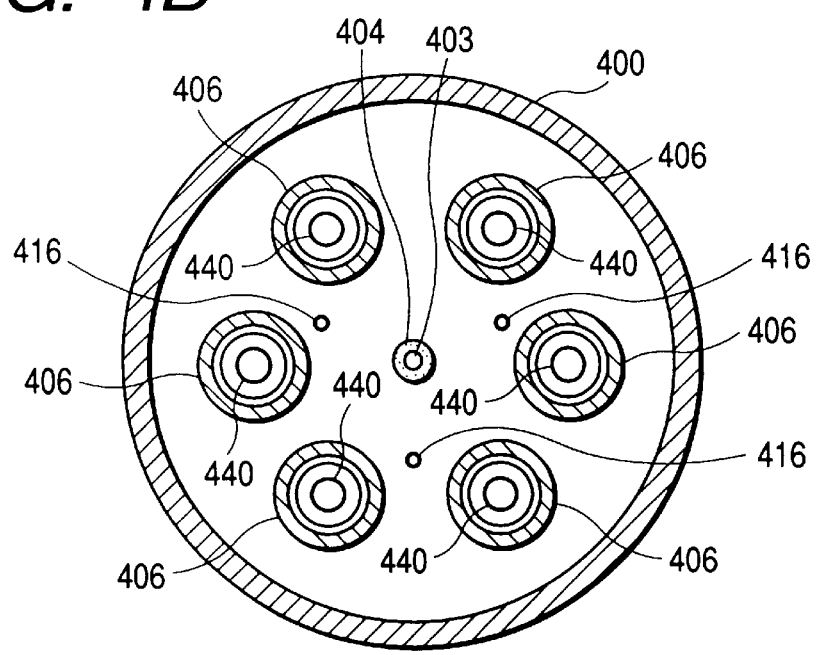

FIG. 4A and FIG. 4B are schematic sectional views of an example of the plasma CVD apparatus of the present invention. FIG. 4B is a sectional view taken along the line 4B—4B of FIG. 4A. In FIGS. 4A and 4B, in the reaction chamber 400, six base member holders 405A are placed along a circle line at predetermined space intervals. A cylindrical base member 406 for film formation is held by the base member holder 405A. In the inside of the respective holders 405A, a heater 440 is provided in the side of the member to heat the cylindrical base member 406 from the inside. The holders 405A are connected respectively to a shaft 431 linked to a motor 432 to be rotated. The auxiliary holding members 405B also hold the cylindrical base members 406. A high frequency electrode 403 is placed at the center of the plasma generation region. A high frequency power source 411 is connected through a matching circuit 409 to an end of a high frequency electrode 403. The high frequency electrode 403 is covered with a dielectric cover 404, and is grounded at the end of the electrode opposite to the power introduction point through an LC circuit 401. An evacuation pipe 407 having an evacuation valve is communicated to an evacuation mechanism 435 equipped with a vacuum pump. A source gas supply system 408, which comprises a gas bomb, a mass flow controller, valves, and so forth, is connected through a gas feeding pipe 417 to gas releasing pipes 416 having gas releasing holes. The numeral 433 indicates sealing members.

When this apparatus is used, the plasma CVD is conducted as described below. The reaction chamber 400 is evacuated to a high vacuum by an evacuation mechanism 435. Then a source gas is introduced into the reaction chamber 400 from a gas supplying means 408 through the gas feeding pipe 417 and gas releasing pipes 416, and the gas pressure is kept at a predetermined pressure. High frequency power is fed from a high frequency power source 411 through a matching circuit 409 to the high frequency electrode 403 to generate plasma between the high frequency electrode and the cylindrical base members 406. Thereby the source gas is decomposed and excited by the plasma to form a deposition film on the cylindrical base members 406.

The material for the dielectric substance cover 404, in the present invention may be selected from any known dielectric substances. The dielectric substance exhibits preferably low dielectric loss, and has preferably a dielectric loss tangent of not higher than 0.01, more preferably not higher than 0.001. The preferred substance includes dielectric polymer materials such as polytetrafluoroethylene, polytrifluorochloroethylene, polyfluoroethylenepropylene and polyimide; glass materials such as quartz glass, and borosilicate glass; ceramics such as boron nitride, silicon nitride, aluminum nitride, and porcelain mainly composed of one or more element oxides including aluminum oxide, magnesium oxide, and silicon oxide. The high frequency electrode 403 for use in the present invention is preferably in a bar-like shape such as a circular shaft, a cylindrical tube, and a prismatic column; or a long plate-like shape.

The frequency of the high frequency power source 409 for use in the present invention ranges preferably from 20 to 600 MHz, more preferably from 60 to 300 MHz.

Figure 5:
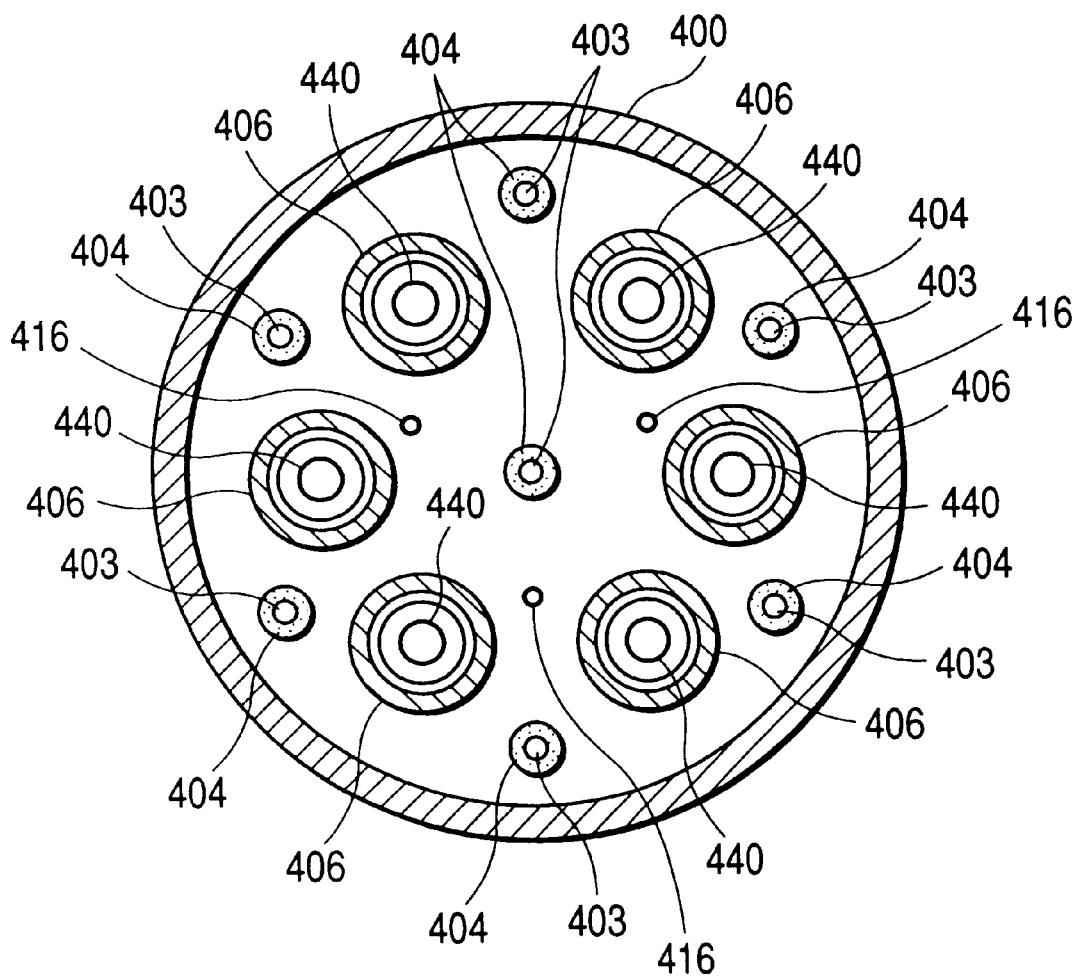

The apparatus, in the present invention, may have such constitution that a plurality of high frequency electrodes 403 are arranged around a cylindrical base member 406 as shown in FIG. 5. Thereby, the entire peripheral surface is exposed continuously to the plasma during the film formation, resulting in a remarkable increase of the deposition rate to improve productivity significantly. By optimizing the number and arrangement of the electrodes, a uniform deposition film can be formed without rotation of the cylindrical base member. Thereby the rotation mechanism may be omitted to simplify the apparatus constitution. Naturally the rotation of the cylindrical base members enables formation of more uniform deposition film.

Figure 6:
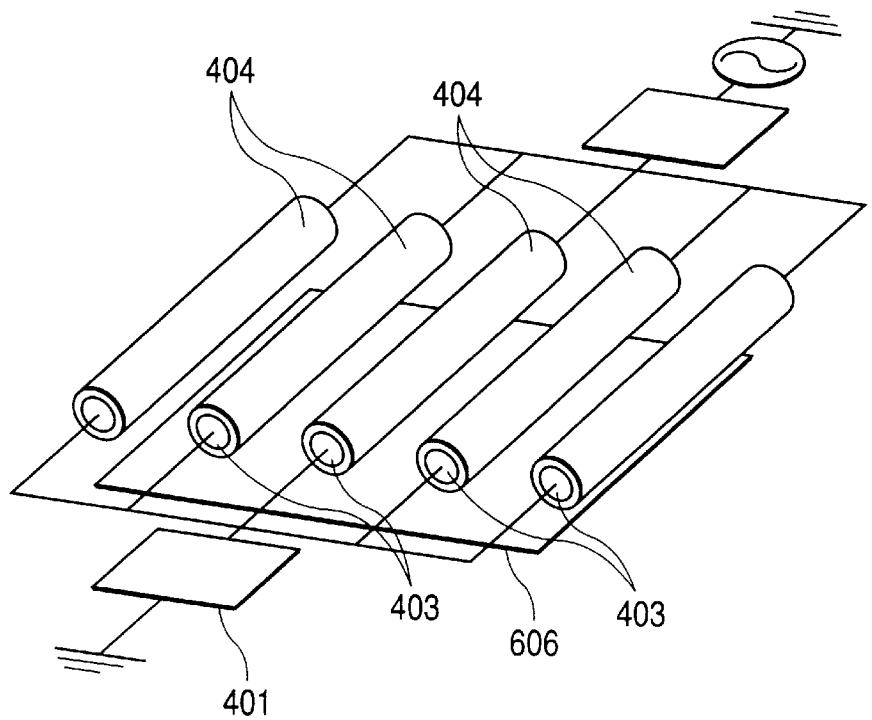

The apparatus may be constituted as shown in FIG. 6 such that a plurality of high frequency electrodes 403 are placed parallel to a plate-shaped base member 606 in the present invention. In such constitution, on the plate-shaped base member of a large area, a high-quality deposition film can be formed with extreme uniformity of film thickness and film quality at a high speed.

Figure 7:
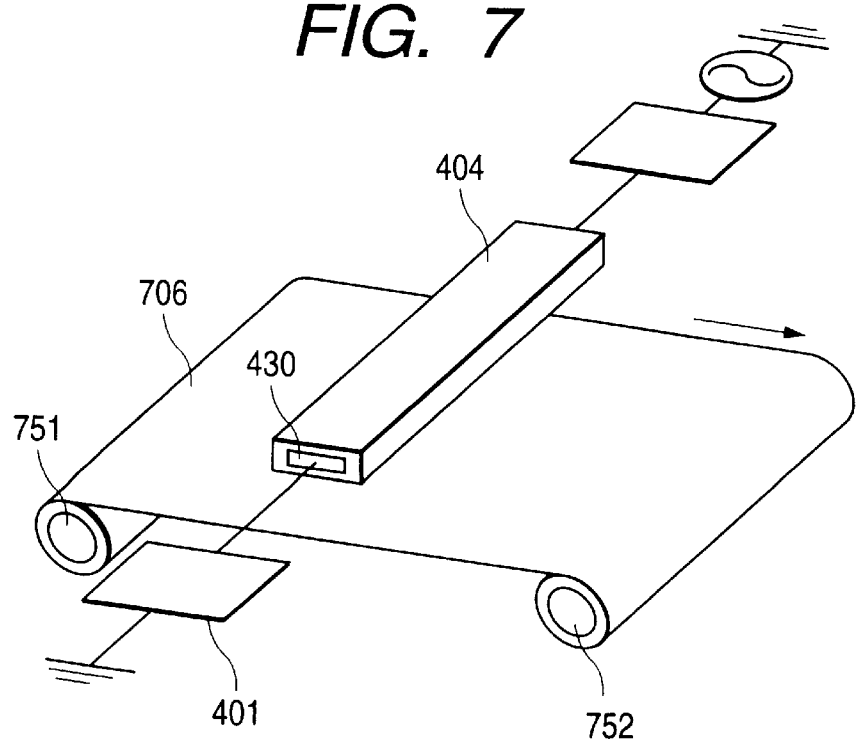

The apparatus may be constituted as shown in FIG. 7 such that one or more high frequency electrodes 403 are placed parallel to a sheet-shaped base member 706 which is delivered from a holding roll 751 and wound by a wind-up roll 752 in the present invention. In such constitution, on the sheet-shaped base member of large area, a high-quality deposition film can be formed with extreme uniformity of film thickness and film quality at a high speed.

In operation of the plasma CVD apparatus, the gas used is suitably selected from known source gases in accordance with the kind of the deposition film to be formed. For formation of an a-Si type deposition film, for example, the preferred source gas includes silane, disilane, high order disilane, and mixtures thereof. For formation of other kind of deposition film, germane, methane, ethylene, and so forth, and mixtures thereof may be employed. The source gas for film formation may be introduced with a carrier gas into a reaction chamber. The carrier gas includes hydrogen gas, and inert gases such as argon gas and helium gas.

A property-improving gas may be used, for instance, for adjusting the bandgap of a deposition film. The gas includes nitrogen atom-containing gases such as nitrogen, and ammonia; oxygen atom-containing gases such as oxygen, nitrogen oxide, and dinitrogen oxide; hydrocarbon gases such as methane, ethane, ethylene, acetylene, and propane; gaseous fluorine compounds such as silicon tetrafluoride, disilicon hexafluoride, and germanium tetrafluoride; and mixtures thereof.

A dopant gas may be used for doping of a formed deposition film. The doping gas includes gases such as diborane, boron fluoride, phosphine, and phosphorus fluoride.

The adjustment of the capacitance is described below in detail referring to drawings.

Figure 8A:
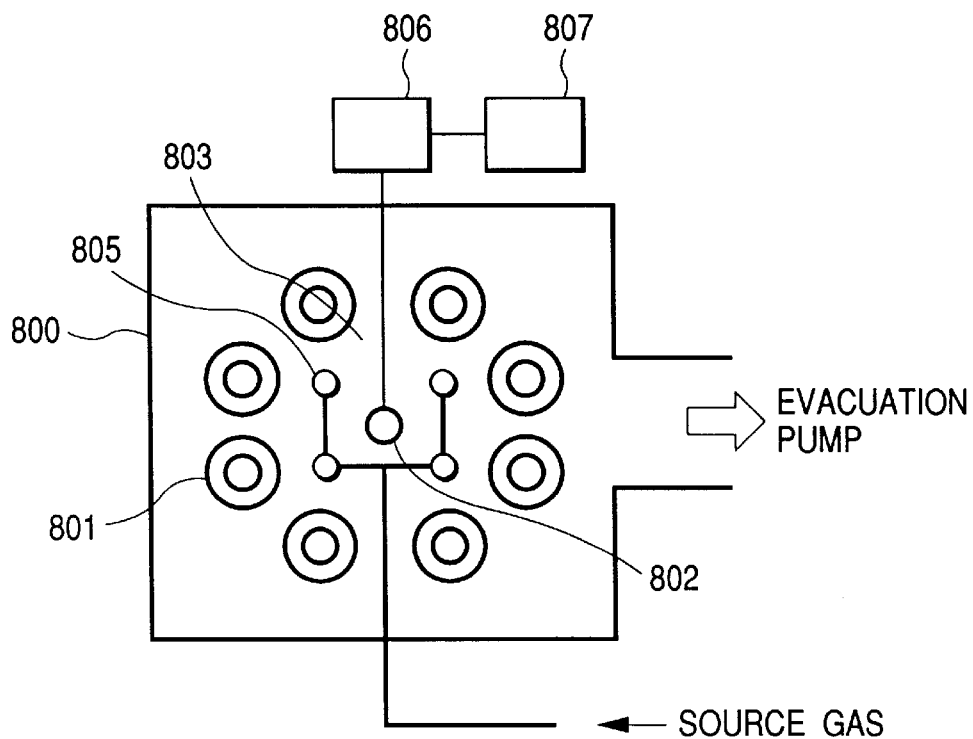
Figure 8B:
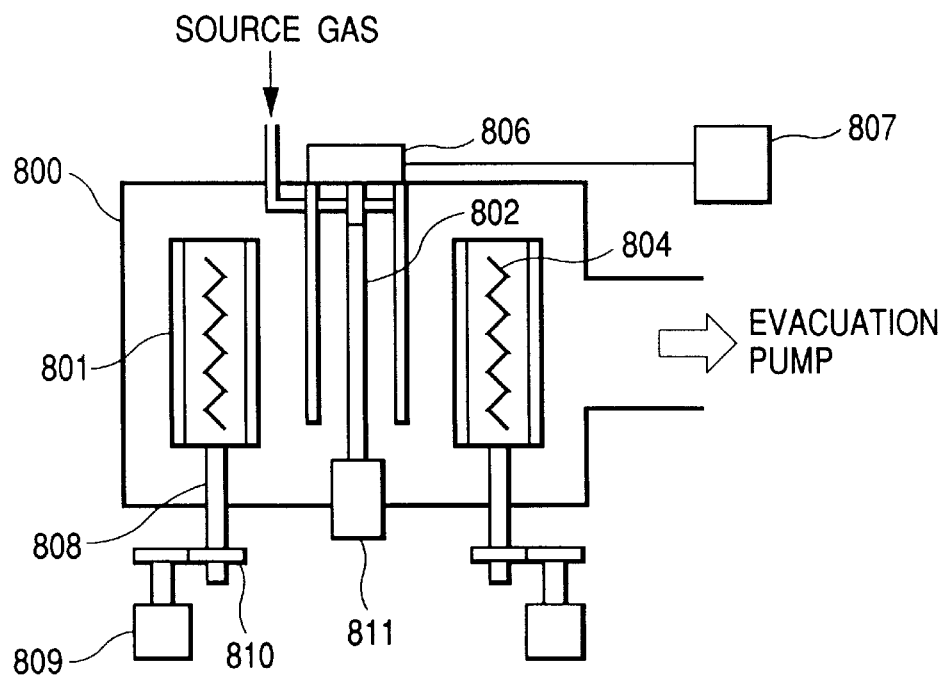

FIGS. 8A and 8B are schematic sectional views of an example of the apparatus for photosensitive member formation of the present invention having a plurality of cylindrical electroconductive base members arranged along a circle line. FIG. 8A is a lateral sectional view, and FIG. 8B is a vertical sectional view.

The apparatus is constituted of a reaction chamber 800, a source gas-feeding device (not shown in the drawings), an evacuation device (not shown in the drawings) for evacuating the interior of the reaction chamber 800, a high frequency power introducing means 802, a power source 807 for supplying electric power to the high frequency power introducing means 802. In the reaction chamber 800, are provided cylindrical electroconductive base members 801, a source gas introducing means 805, heaters 804 for heating the base members, and a high frequency power introducing means 802 parallel to the base members 801.

One end (upper end in FIG. 8B) of the high frequency power introducing means 802 is connected through a matching device 806 to the power source 807. The other end (lower end in FIG. 8B) is connected to a capacitance adjusting means 811.

The base member 801 is held by a rotation axis 808 with interposition of a holder (not shown in the drawings). The rotation axis 808 penetrates through a vacuum seal (not shown in the drawings) to the outside of the reaction chamber 800 and is linked to a motor 809. The source gas introducing means 805 are placed in a glow discharge region 803, and are connected to a source gas supplying means (not shown in the drawings).

Figure 9:
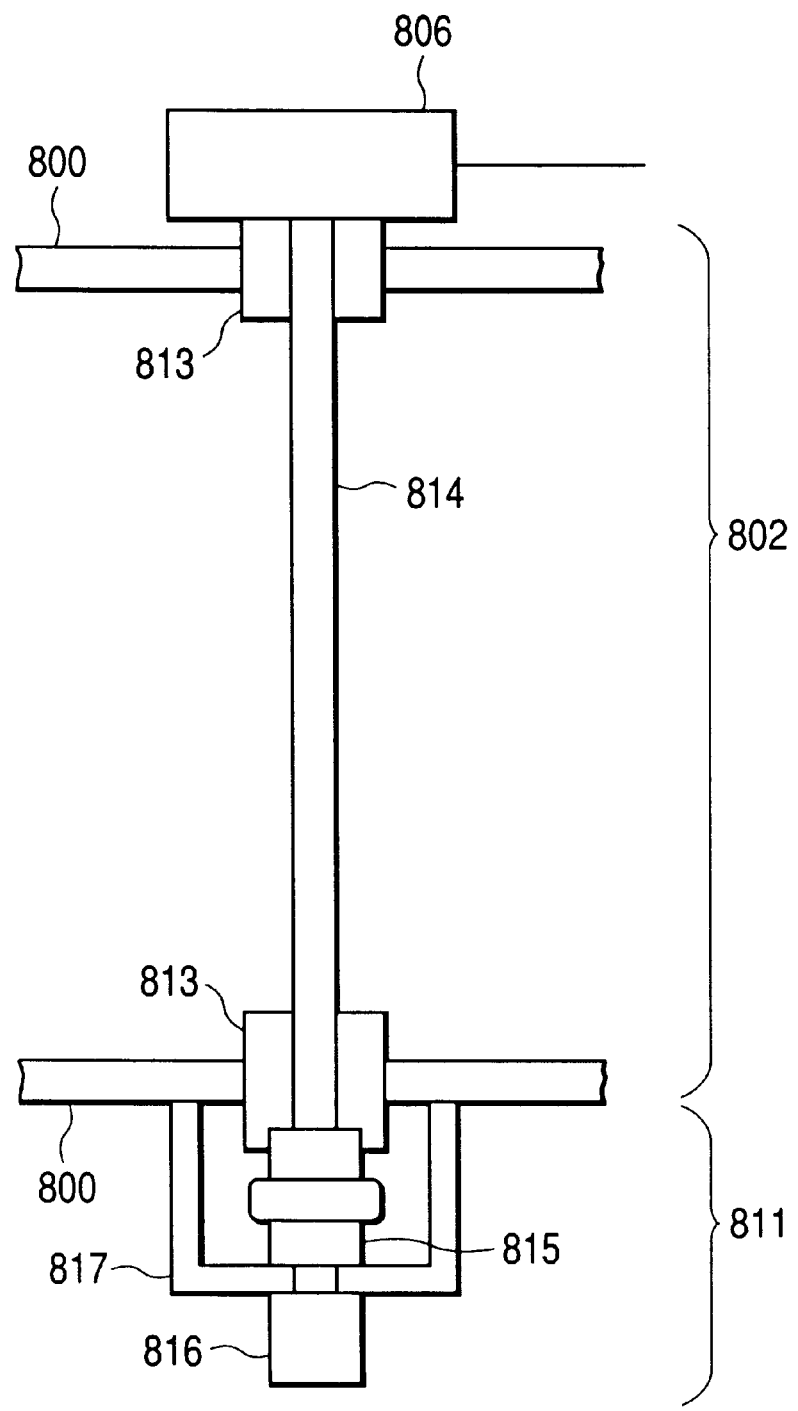
FIGS. 9, 10, 12, 13, 14, 15, and 17 are schematic sectional views for explaining preferable high frequency introducing means.

FIG. 9 shows schematically an example of the high frequency power introducing means employed in the present invention. In FIG. 9, a high frequency power introducing means 802 is constituted of an introduction terminal 813 and an electrode 814. The one end (upper end in FIG. 9) of the electrode 814 is vacuum-sealed by the introduction terminal 813, and is connected at the tip of the electrode to a matching device 806. The other end (lower end in FIG. 9) of the electrode 814 is vacuum-sealed by the introduction terminal 813, and is connected to a capacitance adjusting means 811. The electrode 814 is connected through the capacitance adjusting means 811, a vacuum variable capacitor 815, and a shield 817 to the reaction chamber to be grounded. The capacitance of the vacuum variable capacitor 815 can be adjusted by a driving motor 816. The vacuum variable capacitor 815 may be controlled by other means without employing the motor.

The capacitance can be adjusted, instead of using the vacuum variable capacitor as shown in FIG. 9, by using a usual air variable capacitor. Otherwise, the capacitance can be adjusted by moving an electrode provided at the tip end portion of the high frequency power introducing means.

Figure 10:
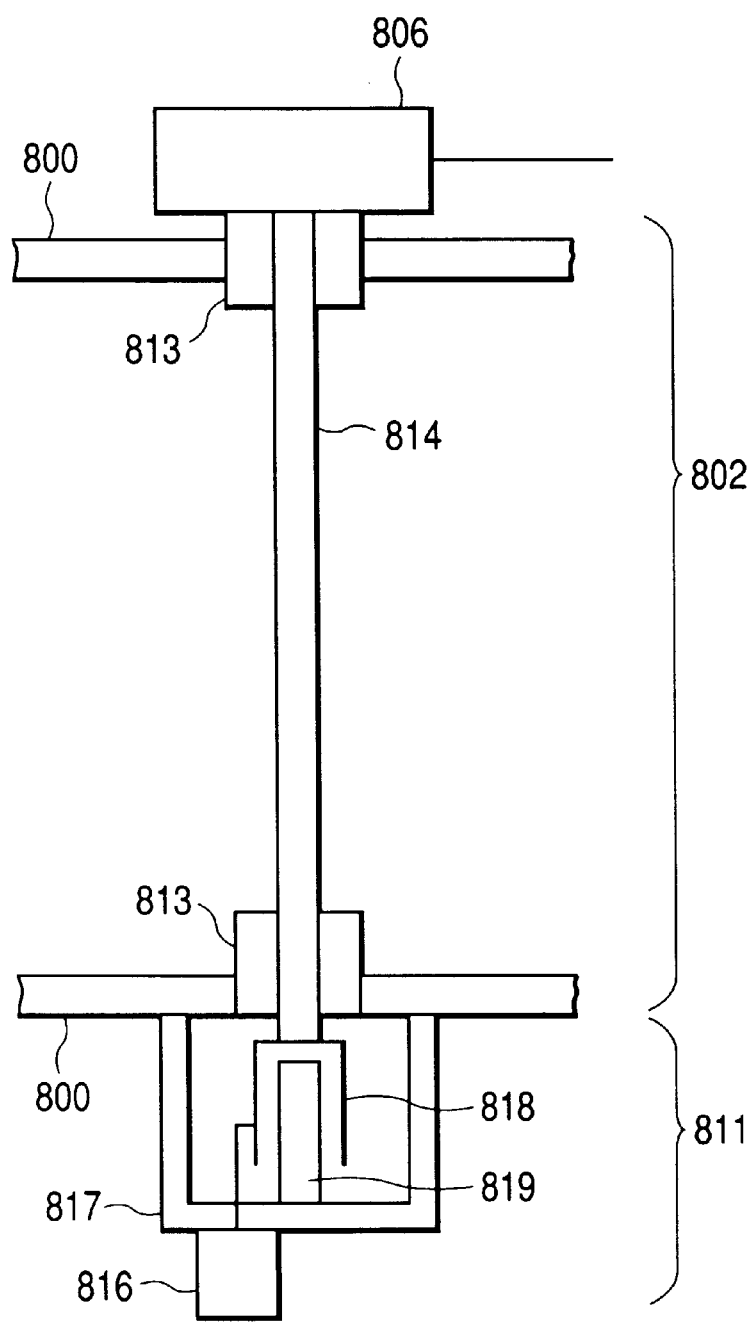

FIG. 10 shows schematically an example of a movable electrode provided at the tip end portion of the high frequency power introducing means. In FIG. 10, a movable electrode 818 is provided at the lower end of the electrode 814 and is linked to a driving motor. The capacitance between the ground electrode 819 and the electrode 814 can be adjusted by moving the movable electrode 818.

In the above methods, the one end of the high frequency power introducing means is preferably connected to a matching device and the other end thereof is grounded through a capacitance adjusting means as shown in FIG. 9 and FIG. 10.

In the present invention, as the method of providing the capacitance adjusting means at the both ends of the high frequency power introducing means, as shown in schematic sectional views, FIGS. 11A and 11B, especially in the vertical sectional view, FIG. 11B, the connection line from the matching device to the high frequency introducing means (hereinafter referred to as "a high frequency introduction route") is branched from the matching device; and the branched lines are respectively connected to each end of the high frequency power introducing means. FIG. 11B shows the constitution that the branched high frequency introduction routes from the matching device are respectively connected to each of the ends of the high frequency power introducing means. In the constitution shown in FIGS. 11A and 11B, a capacitance adjusting means may be provided in series to the high frequency power introducing means between the matching device and at least one of the ends of the high frequency power introducing means.

The material of the electrode of the high frequency power introducing means is not limited provided that the material is electroconductive. The material includes metals such as Al, Cr, Cu, Mo, Au, Ag, In, Nb, Ni, Te, V, Ti, Pt, Pb, and Fe, and alloys thereof such as stainless steel, Inconel, and Hastelloy.

The shape of the high frequency power introducing means is not limited, but is preferably a column, a cylinder, or the like as mentioned above in view of ease of working.

The high frequency power introducing means may be covered with a dielectric material such as a ceramic material on at least a part of the surface exposed to the plasma in the case also where the capacitance is made variable. The ceramic material adheres well to the a-Si film, and prevents peeling of the deposition film from the high frequency power introducing means. The ceramic material includes alumina ceramics, titanium dioxide, aluminum nitride, boron nitride, zircon, cordierite, silicon oxide, beryllium oxide, and mica type ceramics. Of these, alumina, and titanium oxide are preferred in view of durability, and adhesion of the deposition film.

The method of covering the high frequency power introducing means with the ceramic material is not limited. The covering may be conducted by any method. For example, a tubular cover is placed on the introducing means; the surface of the metal is coated by plasma spraying; a metal electrode is formed on the inside wall of a cylindrical ceramic material by metal plating; or a like method. The surface of the high frequency power introducing means or of the ceramic cover may be roughened at least at the side facing the plasma discharge for the purpose mainly of preventing peeling of the deposition film. The roughness is preferably in the range from 5 $\mu$m to 200 $\mu$m in terms of 10-point average roughness (Rz) for the standard length of 2.5 mm. The method of roughening is not limited, and the roughening can be conducted, for example, by blast-finishing.

The number of high frequency power introducing means may be single or plural. For example, in arrangement of a plurality of cylindrical electroconductive base members and one high frequency power introducing means, preferably the cylindrical electroconductive base members are placed on a circle line and the high frequency power introducing means is placed at the center of the circle in view of the uniformity of the formed film. In arrangement of a plurality of high frequency power introducing means, they are preferably placed along a circle line concentric to the circle on which the base members are arranged, as shown in FIG. 5. The arrangement circle line of the high frequency power introducing means may be larger or smaller than the arrangement circle line of the cylindrical electroconductive base members. In other words, a plurality of high frequency power introducing means may be placed on a circle concentric to and inside or outside the arrangement circle of the cylindrical electroconductive base members. When a plurality of high frequency power introducing means are placed on a circle concentric to and outside the arrangement circle of the cylindrical electroconductive base members, preferably at least one high frequency power introducing means is placed inside the arrangement circle of the cylindrical electroconductive base members.

The high frequency power introducing means may be cooled by a cooling means in the present invention. The control of the temperature of the high frequency power introducing means at a desired temperature improves the adhesion between the surface of the introducing means and the deposition film to prevent peeling of the deposition film.

Figure 12:
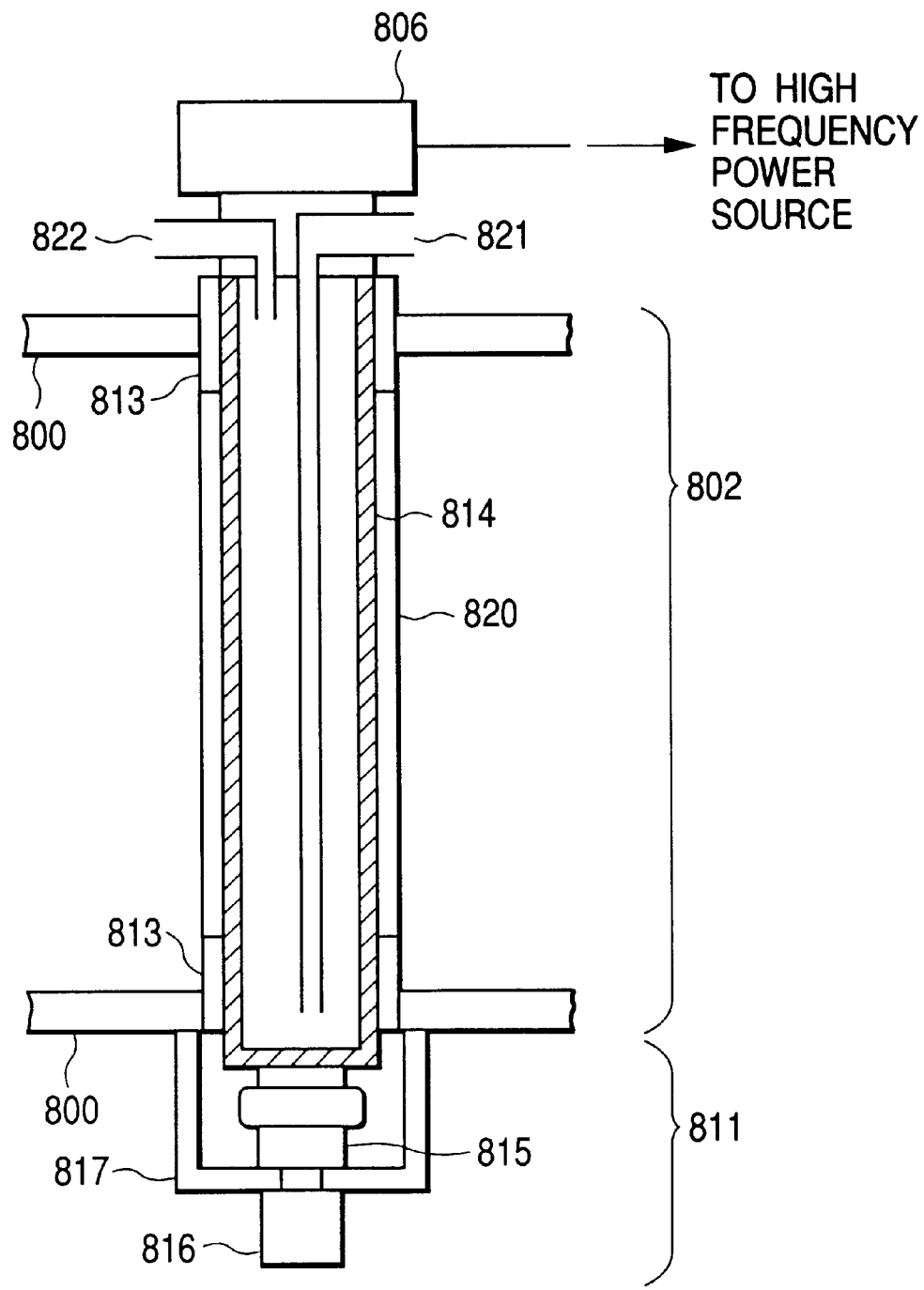

FIG. 12 shows schematically an example of a high frequency power introducing means of the present invention having an electrode covered with a ceramic material and provided with a cooling mechanism. In FIG. 12, the electrode 814 is covered with a ceramic material cover 820, and a coolant introduction tube 821 and a coolant outflow tube 822 are provided for flowing a coolant through the inside space of the electrode 814.

Figure 13:
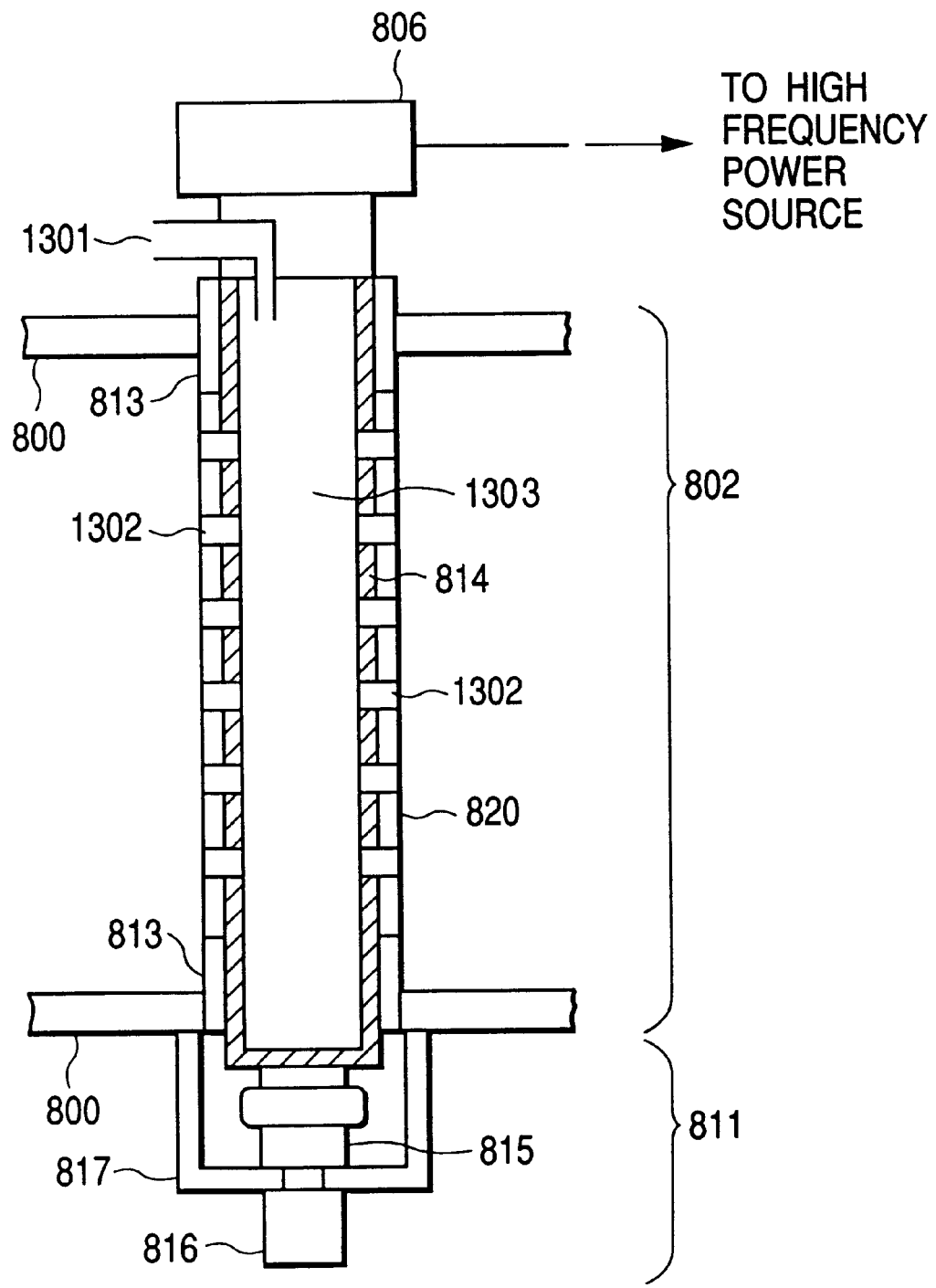
Figure 14:
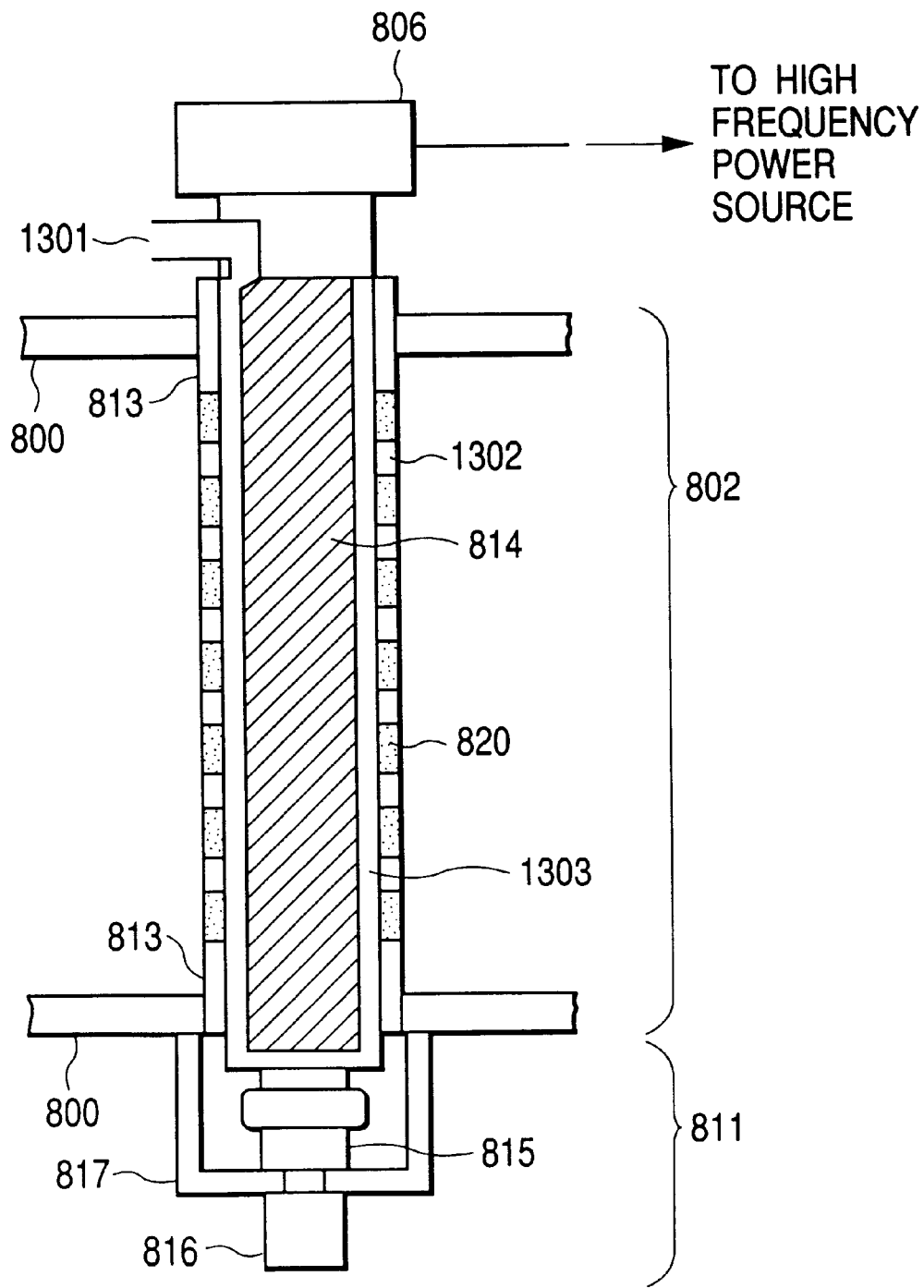

The high frequency power introducing means and the source gas introducing means may be combined as shown in FIG. 13 in the present invention. In FIG. 13, a source gas introduced from the source gas introduction tube 1301 is allowed to flow through a source gas flow path 1303 formed inside the electrode 814, and allowed to flow out from the source gas releasing hole 1302 into the reaction chamber 800. Otherwise, as shown in FIG. 14, the source gas flow path 1303 is formed in the interior of the ceramic cover 820, and the source gas is introduced through source gas releasing holes 1302 in the ceramic material into the reaction chamber 800.

In the present invention, high frequency power is applied to a high frequency power introducing means to decompose a source gas. The applicable frequency of the high frequency power is not specially limited in the present invention. In the experiments conducted by the inventors of the present application, at a frequency lower than 20 MHz, the discharge became sometimes in stable depending on the experimental conditions, which limited the deposition film formation conditions. At a frequency higher than 450 MHz, transmission efficiency of the high frequency power could be lower to result in failure of the continuous discharge. The effects of the present invention tended to be remarkable at a frequency of 50 MHz or higher. Therefore, the frequency is preferably in the range from 20 to 450 MHz, more preferably from 50 to 450 MHz in the present invention. The waveform is not limited, but sine waves and rectangular waves are suitable. The intensity of the high frequency power is selected suitably in accordance with the intended characteristics of the deposition film, and other properties, and is preferably in the range from 10 to 5000 W, more preferably from 20 to 2000 W per one base member.

The number of the cylindrical electroconductive base members and the arrangement thereof are not specially limited provided that the members are placed parallel to the high frequency power introducing means 802. When a plurality of electroconductive base members are placed, they are preferably arranged, as described above, along a circle and the high frequency power introducing means is placed at the center of the circle to form the glow discharge region 803 in the space surrounded by the base members. The number of the electroconductive base members is not limited provided that they can form the discharge space. Preferably four or more members are used. In the example shown in FIGS. 8A and 8B, eight base members are arranged.

Any number of source gas introducing means 805 may be used: one gas introducing means, or the same number thereof as the number of the base members. When an even number of base members is used, the half number of the gas introducing means with respect to the number of the base members are suitably employed. The high frequency power introducing means and the source gas introducing means may be combined as described above.

The cylindrical electroconductive base member 801 is heated from the inside by a base member heater 804 provided within the reaction chamber 800. The base member heater 804 is not limited provided that it is suitable for vacuum use, and includes electric resistors such as sheath heaters wound around a pipe, plate-shaped heaters, and ceramic heaters; heat radiators such as halogen lamps; a heating member employing a heat-exchanged gas or liquid. Instead of providing the heater in the reaction chamber 800, a base member-heating chamber may be provided separately from the reaction chamber, and the base member may be heated therein preliminarily and transferred under vacuum into the reaction chamber 800. Otherwise, the heating by the base member heating means and the heating in the reaction chamber 800 may be combined. The temperature of the base member is selected suitably in accordance with the intended characteristics of the deposition film, and is usually in the range preferably from 20 to 500° C., more preferably from 50 to 480° C., still more preferably from 100 to 450° C. When an amorphous silicon type deposition film is formed, the temperature of the base member is preferably 60 to 400° C., more preferably 100 to 350° C.

A procedure of forming a photosensitive member is described below by using the apparatus as shown in FIGS. 8A and 8B as a representative example.

By using this apparatus, for example, a deposition film is formed as below. Cylindrical electroconductive base members 801 having been degreased and washed are placed in a reaction chamber 800. The reaction chamber 800 is evacuated by an evacuation system (e.g., a vacuum pump) not shown in the drawing. Then the base members 801 are heated by heaters 804 to a desired temperature ranging from 20 to 500° C. with the base member rotated.

After the base members 801 have been heated to the desired temperature, a source gas is fed from a source gas feeding system through source gas introducing means 805 into the inner chamber 800. At the time of feeding the source gas, care should be taken not to cause sudden gas gushing or excessive pressure variation. After the source gas flow rate has reached a predetermined level, the internal pressure is controlled to a desired level by adjusting an evacuation valve (not shown in the drawing) by monitoring a manometer (not shown in the drawing). After the internal pressure has been stabilized, a high frequency power is applied from a high frequency power source 807 set at a desired power level through a matching device 806 to a high frequency power introducing means 802 to cause glow discharge. Simultaneously the capacitance at the electrode tip end is adjusted by operating a driving motor of a capacitance controlling means 811 to make the discharge uniform.

The source gas introduced into the reaction chamber 800 is decomposed by the discharge energy to form in tended deposition films on the cylindrical electroconductive base members 801. During the film formation, the cylindrical electroconductive base members 801 are rotated by motors 809 to form the deposition film on entire surfaces of the base members.

When the deposition films have been formed in the desired thickness, application of the high frequency power and introduction of the source gas are stopped to finish the deposition film formation.

When a photosensitive member having a plurality of layers is formed to obtain intended photosensitive characteristics, the above operation is repeated to form a photosensitive member having the intended layer constitution.

The cylindrical electroconductive base member is used in the present invention and is usually made from an electroconductive material or a material surface-treated for electric conduction. The electroconductive substance includes metals such as Al, Cr, Mo, Au, In, Nb, Ni, Te, V, Ti, Pt, Pb, and Fe, and alloys thereof. The substance to be surface-treated for electric conduction includes ceramics such as alumina ceramics, aluminum nitride, boron nitride, silicon nitride, silicon carbide, silicon oxide, and beryllium oxide; glass such as quartz glass, and pyrex glass; and synthetic resins such as polycarbonates, polyamides, polyimides, and teflons. When the base member surface-treated is used, the surface treatment for electric conduction is preferably practiced both on the deposition film formation surface of the base member and on the reverse surface.

As the source gas in the present invention, for example, in formation of amorphous silicon, a Si source gas is effectively used which includes gaseous or gasifiable silicon hydrides (silanes) such as $SiH_4$, and $Si_2H_6$; fluorine-containing silicon compounds (fluorine-substituted silane derivatives) such as $SiF_4$, and $Si_2F_6$; and fluorine-substituted silicon hydrides such as $SiH_3F$, $SiH_2F_2$, and $SiHF_3$. The Si-feeding source gas may be diluted, if necessary, with $H_2$, He, Ar, Ne, or a like gas without any problem.

In addition to the above gas, atoms of Group III or Group V of Periodic Table may be used as a dopant, if necessary. For doping with boron atoms, the boron-containing gas includes boron hydrides such as $B_2H_6$, and $B_4H_{10}$; and boron halides such as $BF_3$, and $BCl_3$. For doping with phosphorus atoms, the phosphorus-containing gas includes phosphorus hydride such as $PH_3$, and $P_2H_4$.

For formation of amorphous silicon carbide (a-SiC), for example, a carbon-introducing gas is used together with the above Si-feeding gas as the effective source gas. The carbon-introducing gas is constituted of C and H, including saturated hydrocarbons of 1 to 5 carbons, ethylenic hydrocarbons of 2 to 4 carbons, and acetylenic hydrocarbons of 2 to 3 carbons. Specifically the saturated hydrocarbons include methane ($CH_4$), and ethane ($C_2H_6$); the ethylenic hydrocarbons include ethylene ($C_2H_4$), and propylene ($C_3H_6$); and the acetylenic hydrocarbons include acetylene ($C_2H_2$), and methylacetylene ($C_3H_4$).

For formation of amorphous silicon oxide (a-SiO), for example, an oxygen-introducing gas is used with the above Si-feeding gas. The oxygen-introducing gas includes oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and compounds constituted of silicon (Si), oxygen (O), and hydrogen (H) such as lower siloxane including disiloxane ($H_3SiOSiH_3$), and trisiloxane ($H_3SiOSiH_2OSiH_3$).

For formation of amorphous silicon nitride (a-SiN), for example, a nitrogen-introducing gas is used with the above Si-feeding gas. The nitrogen-introducing gas includes gaseous or gasifiable nitrogen, nitrides, and azide such as nitrogen ($N_2$), ammonia ($NH_3$), hydrazine ($H_2NNH_2$), and hydrogen azide ($HN_3$).

For simultaneous feed of nitrogen atoms and halogen atoms, nitrogen halide compounds may be used such as nitrogen trifluoride ($F_3N$) and nitrogen tetrafluoride ($F_4N_2$).

The gas pressure in the reaction chamber is selected suitably for the properties of the intended deposition film. The pressure is preferably in the range from 0.01 to 1000 Pa, more preferably 0.03 to 300 Pa, still more preferably from 0.1 to 100 Pa.

The present invention is explained referring to Examples without limiting the invention.

EXAMPLE 1

Figure 15:
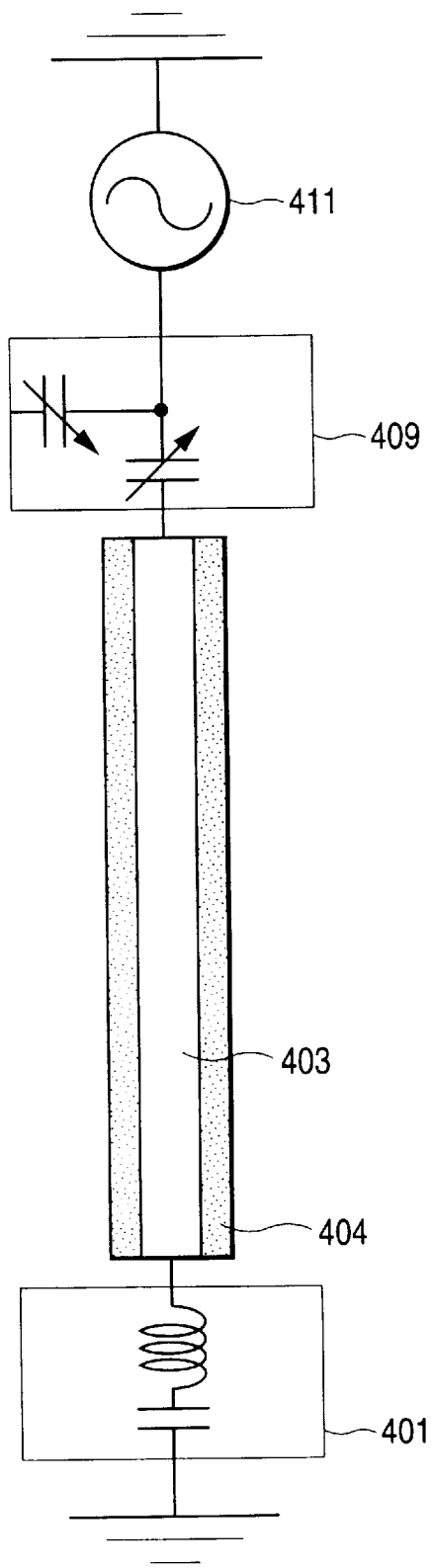

A high frequency power source 411 as shown in FIG. 4A was employed at a frequency in the range from 30 to 600 MHz. A cylindrical high frequency electrode 403 as shown in FIG. 15 was employed. This electrode was covered with a dielectric cover 404 made of alumina ceramics. The high frequency power was introduced at one end (a power introducting point) of the electrode, and the other end was grounded through an adjustable LC circuit 401. The LC circuit was adjusted to have an absolute reactance of not higher than 50Ω at the employed frequency. The film formation conditions were the same as in Comparative Examples described later: high frequency power of 1 KW, $SiH_4$ gas flow rate of 500 sccm, film formation pressure of 50 mTorr, 25 mTorr, or 5 mTorr, and base member temperature of 250° C. The film formation procedure was conducted similarly to Comparative Example 1 and thereby, an amorphous silicon film was formed on cylindrical base members 406 and on a base plate for electrical property evaluation.

The amorphous silicon film formed as above was evaluated for the film quality and distribution thereof, and the deposition rate and distribution thereof in the same manner as in Comparative Example 1.

Table 1, Table 2, and Table 3 show respectively the evaluation results of the sensitivities of sample films formed under the pressure conditions of 50 mTorr, 25 mTorr, and 5 mTorr. Table 4 shows the evaluation results of the deposition rate. Table 5 shows film formation conditions together with the conditions in other Examples and Comparative Examples.

At a frequency of 30 MHz of the high frequency power, all the films formed at a pressure of 50 mTorr had a photosensitivity in the range from $8\times10^3$ to $2\times10^4$; the film properties of the formed films were of no problem in practical use (Δ), or good (○) (Table 1); the average deposition rate was 0.5 nm/s; and the deposition rate distribution was 6% (Table 4). All the films formed at a pressure of 25 mTorr at the same frequency had a photosensitivity in the range from $1\times10^4$ to $3\times10^4$; the film properties was good (○) (Table 2); the average deposition rate was 0.5 nm/s; and the deposition rate distribution was 6% (Table 4). At the pressure of 5 mTorr, the discharge did not occur.

At a frequency in the range from 60 MHz to 300 MHz of the high frequency power, all the films formed at a pressure of 50 mTorr had a photosensitivity in the range from $1\times10^4$ to $3\times10^4$; the film properties were good (○) (Table 1); the average deposition rate was 1–18 nm/s; and the deposition rate distribution was 4–6% (Table 4). At the pressure of 25 mTorr at the same frequency, all the films formed had a photosensitivity in the range from $4\times10^4$ to $8\times10^4$, the film properties were good (○) (Table 2); the average deposition rate was 0.9–2.0 nm/s; and the deposition rate distribution was 4–5% (Table 4). At the pressure of 5 mTorr at the same frequency, all the films formed had a photosensitivity in the range from $1\times10^5$ to $5\times10^5$; the film properties were excellent (⊚) (Table 3); the average deposition rate was 1.0–1.7 nm/s and the deposition rate distribution was 4% (Table 4).

At a frequency in the range from 400 MHz to 600 MHz of the high frequency power, all the films formed at a pressure of 50 mTorr had a photosensitivity in the range from $7 \times 10^3$ to $1 \times 10^4$; the film proper ties were of no problem in practical use (Δ) (Table 1); the average deposition rate was 0.6–0.7 nm/s; and the deposition rate distribution was 6–8% (Table 4). At the pressure of 25 mTorr at the same frequency, all the films formed had a photosensitivity in the range from $1 \times 10^4$ to $3 \times 10^4$; the film properties were good (○) (Table 2); the average deposition rate was 0.6–0.7 nm/s; and the deposition rate distribution was 6–8% (Table 4). At the pressure of 5 mTorr at the same frequency, all the films formed had a photosensitivity in the range from $5 \times 10^4$ to $8 \times 10^4$, the film properties being good (○) (Table 3); the average deposition rate was 0.5–0.7 nm/s; and the deposition rate distribution was 6–7% (Table 4).

EXAMPLE 2

Electrophotographic photosensitive members were prepared by use of the apparatus shown in FIGS. 4A and 4B under the conditions of giving the photosensitivity of not lower than 105 in Example 1, namely, the pressure of 5 mTorr, the power frequency of 60 MHz, 100 MHz, 200 MHz, or 300 MHz. The LC circuit 401 was the same as the one used in Example 1 for respective power frequencies.

On six cylindrical Al base members, a charge injection inhibition layer, a photoconductive layer, and a surface protection layer were formed in this order under the film forming conditions shown in Table 6 to complete electrophotographic photosensitive members.

The photosensitive member samples obtained under the respective power frequency conditions were evaluated for chargeability of the member, and the density and defects of the formed image. As the results, any of the electrophotographic photosensitive members was found to be excellent in the evaluated items over the entire surface thereof, and to have excellent electrophotographic characteristics.

EXAMPLE 3

By the apparatus shown in FIG. 5, film formation was conducted on six cylindrical tubular Al base members 406 of 108 mm diameter, 358 mm long, and 5 mm thick placed in the reaction vessel 403. The base members were not rotated. Seven high frequency electrodes 403 which had the same construction as the one in Example 1 were placed in the reaction chamber as shown in FIG. 5. The frequency of the high frequency power source was set at 100 MHz. Amorphous silicon films were formed on the six tubular base members under the film formation conditions shown in FIG. 5.

The deposition rate and the deposition rate distribution were evaluated by the procedure described below. One of the six tubular base members was taken out. Lines were drawn in the axis direction at line intervals of about 20 mm, and in the circumference direction at line intervals of about 32 mm. At the 180 intercepting points of the lines, film thicknesses were measured by using an eddy current type thickness gauge used in Experiment 1. The deposition rates at the respective measurement points were calculated from the measured thicknesses, and the rates were averaged to obtain the average deposition rate . The calculated average deposition rate was 7.2 nm/s. The deposition rate distribution for one line in the axis direction was obtained by deriving the difference between the maximum and the minimum of the deposition rates measured at 18 depositions along the line in the axis direction, and dividing the difference by the average deposition rate for the 18 points. In the same manner, the average deposition rate distribution values for one line were derived for other nine lines respectively. The deposition rate distribution values for the ten lines were averaged. The overall deposition rate distribution in the axis direction was represented by this average in percentage. The obtained deposition rate distribution in the axis direction was 5%. The deposition rate distribution for one line in the circumference direction was obtained by deriving the difference between the maximum and the minimum of the rates measured at 10 depositions along the line in the circumference direction, and dividing the difference by the average deposition rate for the 10 points. In the same manner, the average deposition rate distribution values for one line were derived for other 17 lines respectively. The deposition rate distribution values for the 18 lines were averaged. The overall deposition rate distribution in the circumference direction was represented by this average in percentage. The obtained deposition rate distribution in the circumference direction was 9%.

EXAMPLE 4

Electrophotographic photosensitive members were prepared by an apparatus having the same constitution as the one used in Example 3.

On six cylindrical Al base members respectively, a charge injection inhibition layer, a photoconductive layer, and a surface protection layer were formed in this order under the film forming conditions shown in Table 7 to complete electrophotographic photosensitive members.

The photosensitive member samples obtained were evaluated for chargeability of the member, and the density and defects of the formed image. As the results, any of the electrophotographic photosensitive members was found to be excellent in the evaluated items over the entire surface thereof, and to have excellent electrophotographic characteristics.

EXAMPLE 5

Amorphous silicon films were formed on six cylindrical tubular base members in the same manner as in Example 3 except that the base members were rotated during the film formation. The deposition rate and the deposition rate distribution were evaluated in the same manner as in Example 3. The average deposition rate was 7.2 nm/s, the deposition rate distribution in the axis direction was 5%, and that in the circumference direction was 3%.

EXAMPLE 6

Electrophotographic photosensitive members were prepared by an apparatus having the same constitution as the one used in Example 5.

On six cylindrical Al base members respectively, a charge injection inhibition layer, a photoconductive layer, and a surface protection layer were formed in this order under the film forming conditions shown in Table 7 to complete electrophotographic photosensitive members.

The photosensitive member samples obtained were evaluated for chargeability of the member, density and image defects of the formed image. As the results, any of the electrophotographic photosensitive members was found to be excellent in the evaluated items over the entire surface thereof, and to have excellent electrophotographic characteristics.

EXAMPLE 7

Film formation was conducted on a flat plate-shaped glass base member of 500 mm square and 1 mm thick by means of a device shown in FIG. 6 placed in a reaction chamber. Five high frequency electrodes were placed in the reaction chamber. An amorphous silicon film was formed on the flat base member at a frequency of the high frequency power source of 250 MHz under the film formation conditions shown in Table 6. The deposition rate and the deposition rate distribution were evaluated as below. On the amorphous silicon film deposited on the flat base member, lines were drawn in a vertical direction at intervals of about 30 mm and in a lateral direction at intervals of about 30 mm. The film thickness was measured at the 256 intersecting points by means of the eddy current type thickness gauge used in Experiment 1. The deposition rates at the respective measurement points were calculated from the measured thicknesses, and the rates were averaged to obtain the average deposition rate. The calculated average deposition rate was 6.5 nm/s. The deposition rate distribution was obtained by deriving the difference between the maximum and the minimum of the deposition rates measured at the 256 points, and dividing the difference by the average deposition rate, being represented in percentage. The deposition rate distribution was 8%.

EXAMPLE 8

Film formation was conducted on a sheet-shaped stainless base member 706 of 500 mm wide and 0.1 mm thick by means of a device shown in FIG. 7 placed in a reaction chamber while the sheet-shaped base member were wound up continuously by a wind-up roll 752. One high frequency electrode was placed in the reaction chamber. The high frequency electrode 403 was made of Al in a shape of a long plate having a cross-section of 40 mm×10 mm and length of 600 mm, and was covered with an alumina ceramic dielectric cover 404 of 5 mm thick. An amorphous silicon film was formed on the sheet-shaped base member at a frequency of the high frequency power source of 550 MHz under the film formation conditions shown in Table 8. A portion of the sheet-shaped base member was cut out in a length of 500 mm. The deposition rate and the deposition rate distribution were evaluated in the same manner as in Example 6. The average deposition rate was 1.5 nm/s, and the deposition rate distribution was 5%.

COMPARATIVE EXAMPLE 1

This experiment was conducted according to the RF plasma CVD technique with a concentric type plasma treatment apparatus. That is, amorphous silic on films were formed on the entire peripheral surface of respective cylindrical base members at various frequencies of the high frequency power source by means of a plasma CVD apparatus for film deposition shown in FIGS. 2A and 2B. In the formation of the amorphous silicon films, effects of the frequency of the high frequency power source were observed on the quality of the deposition film and distribution thereof, and the deposition rate and distribution thereof. In the initial experiment conducted at a pressure condition of about 0.2 Torr as described in "Plasma Chemistry and Plasma Proceeding", Vol. 7, No. 3, 1987, PP. 267–273, powdery matters like polysilane were remarkably produced. Therefore, an experiment was conducted at a pressure of 50 mTorr or lower by the procedure as described below.

In the present comparative Example, the film formation was conducted on six cylindrical tubular Al base members each of 108 mm diameter, 358 mm long, and 5 mm thick placed in a reaction chamber 200 with rotation of the tubular base members in each experiment. The high frequency electrode 203 was used which has a shape of a circular column made of Al of 20 mm diameter and 450 mm long. For evaluation of the electric characteristics as the film quality evaluation, a Corning #7059 glass base plate having a comb type Cr electrode of 250 $\mu$m gap vapor-deposited thereon was placed on the surface of one of the six tubular base members in the axis direction over the length of 358 mm.

Next, the reaction chamber 200 was evacuated by an evacuation mechanism 235 to adjust the internal pressure to $1\times10^6$ Torr. Current was supplied to heaters 240 to heat and keep the tubular base members 206 at a temperature of 250° C. Gaseous $SiH_4$ was introduced at a flow rate of 500 sccm from a source gas feeding means 208 through a gas feed pipe 217 and gas releasing pipes 216 into the reaction chamber 200. The internal pressure was adjusted to any one of 3 levels of 50 mTorr, 25 mTorr, and 5 mTorr for the respective experiments. Then a high frequency in the range of from 13.56 MHz to 650 MHz was generated by a high frequency power source 211 at high frequency power of 1 KW under respective pressure conditions, and the high frequency was applied through a matching circuit 210 to the high frequency electrode 203. The high frequency power source 211 was selected which is capable of generating the high frequency power in the above frequency range. The matching circuit 209 was suitably adjusted in accordance with the frequency of the high frequency power source. Thereby, an amorphous silicon film was formed on the respective tubular base members 206 and the glass base plate for electric characteristic evaluation.

The film quality and the film quality distribution were evaluated by measuring photosensitivity ((photoconductivity σp)/(dark conductivity σd)) at 18 positions at about 20 mm intervals from the top end to the bottom end of the electric characteristics evaluation base plate. The photoconductivity σp was measured by electroconductivity on irradiation of He—Ne laser (wavelength: 632.8 nm) at an intensity of 1 mW/cm$^2$. According to the knowledge of the inventors of the present application on electrophotographic photosensitive member production, images sufficient for practical use can be obtained in an electrophotographic photosensitive member produced under the optimized conditions for giving the deposition film of photosensitivity of not lower than $10^3$, However, the higher contrast of the image in recent years requires the photosensitivity of not lower than $10^4$. In the near future, it would be required to be not lower than $10^5$. In view of the above fact, the photosensitivity was evaluated by the standard as described below.

⊚: Photosensitivity being not lower than $10^5$, and film characteristics being excellent, ○: Photosensitivity being not lower than $10^4$, and film characteristics being good, Δ: Photosensitivity being not lower than $10^3$, and film characteristics being of no problem in practical use, ×: Photosensitivity being lower than $10^3$, not satisfying requirements.

The deposition rate and the deposition rate distribution were evaluated by measuring the film thickness at 18 positions at intervals of about 20 mm along the axis direction on one of the five tubular base member having an a-Si film deposited thereon, similarly to the measurement positions of the above photosensitivity, by means of an eddy current type film thickness gauge (manufactured by Kett Laboratory). The deposition rates were calculated for the 18 points, and averaged to obtain the average deposition rate. The deposition rate distribution in the axis direction was evaluated by obtaining the difference between the maximum and the minimum of the deposition rates of the above 18 points and calculating the ratio of [(maximum−minimum)/average], and was represented in percentage.

The photosensitivities of the film samples formed under the pressure conditions of 50 mTorr, 25 mTorr, and 5 mTorr are shown respectively in Tables 8, 9, and 10. The deposition rates thereof are shown in Table 11.

At the high frequency power of 13.56 MHz under a pressure of 50 mTorr, the films of relatively uniform quality were formed at a relatively uniform deposition rate, but the average deposition rate was very low value of 0.15 nm/s; and under a pressure of 25 mTorr or lower, the discharge could not be generated.

At the high frequency power of 30 MHz under a pressure of 50 mTorr, or 25 mTorr, the photosensitivities of the formed films were lower at the upper positions of the tubular base members, and the deposition rate distributions at 50 mTorr were broader although the average deposition rates were three times as large as that at 13.56 MHz; at 25 mTorr, the discharge was interrupted at a probability of about one per three film formation operations; and at 5 mTorr, the discharge could not be generated.

At the high frequency power of 60 to 300 MHz, the photosensitivities of the formed films were lower at the upper middle portions and lower middle portions of the tubular base members, and at the other portions the photosensitivity tends to be increased with decrease of pressure, and the average deposition rate was about 7 to 12 times as large as that at 13.56 MHz, but the deposition rate distribution was broader; at the pressure conditions of 5 mTorr, the discharge was interrupted at a probability of about one per five film formation operations.

At the high frequency power of 400 to 600 MHz, the photosensitivities of the formed films were lower at a plurality of positions of the tubular base members, and at the other portions the photosensitivity tends to be increased with decrease of pressure, and the average deposition rate was about 4 to 6 times as large as that at 13.56 MHz, but the deposition rate distribution was broader; at the pressure conditions of 5 mTorr, the discharge was interrupted at a probability of about one per three film formation operations.

At the high frequency power of 650 MHz, the discharge occurred discontinuously under any of the tested pressure conditions, and no evaluation film was obtained.

From the above experimental results, it was found that at the frequency of the high frequency power of 30 MHz or higher, the discharge could be generated even at a high vacuum where a gas reaction was not readily caused, whereby excellent film quality can be obtained and the deposition rate was improved in comparison with that at 13.56 MHz, that the discharge was not sufficiently stable, and that the film quality distribution and the deposition rate distribution became broader.

COMPARATIVE EXAMPLE 2

An amorphous silicon film was formed on a flat plate glass base member of 500 mm square and 1 mm thick placed as a counter electrode 105 in a conventional parallel type apparatus as shown in FIG. 1 under the film formation conditions shown in Table 5. The formed film was evaluated for the deposition rate and the deposition rate distribution in the same manner as in Example 7. The average deposition rate was 3.5 nm/s, and the deposition rate distribution was 85%.

Next, the state of the plasma was analyzed.

EXPERIMENT 1

A high frequency power introducing means shown in FIG. 9 of the present invention was set in a apparatus shown in FIGS. 8A and 8B. The nonuniformity of the plasma was tested by measuring the electron temperature by means of a single probe (Langmuir probe). In this experiment, the length of the high frequency power introducing means was 420 mm, and the capacitance of the high frequency power introducing means was adjusted to cause uniform plasma discharge under the conditions shown in Table 12. The single probe had a mechanism for moving in the vacuum. The electron temperature was measured at intervals of 20 mm along the direction of the generatrix of the high frequency power introducing means.

Figure 16:
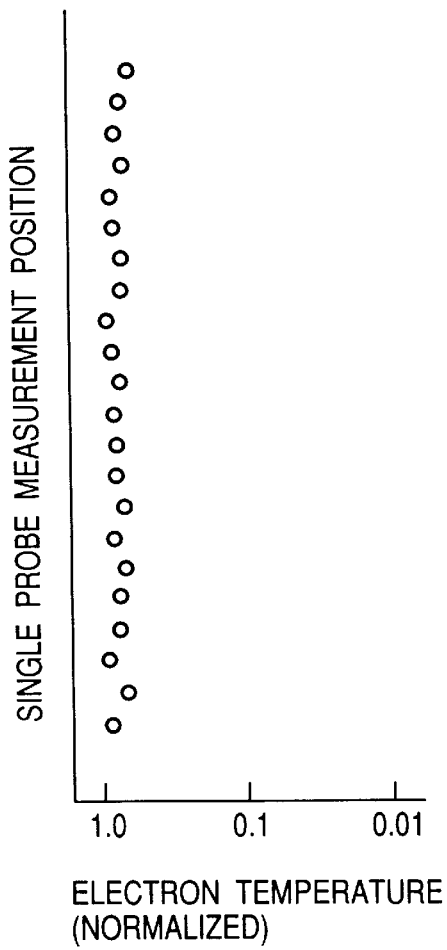

The distribution of the measured electron temperatures is shown in FIG. 16. In FIG. 16, the values of the electron temperature were normalized by regarding the highest measurement value as 1. As shown in FIG. 16, uniform distribution was obtained without drop (hereinafter referred to as "valley") of the electron temperature by controlling the capacitance at the tip end portion of the high frequency power introducing means.

COMPARATIVE EXPERIMENT 1

Figure 17:
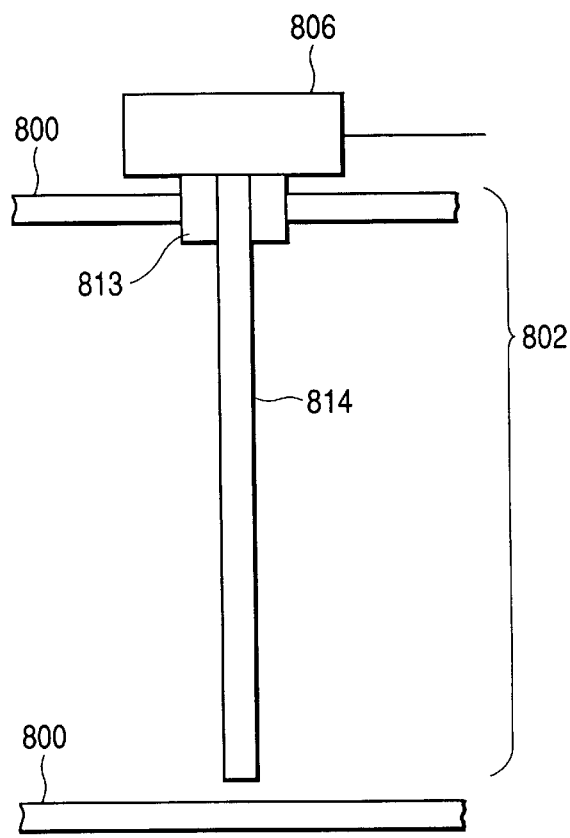

The distribution of electron temperatures was measured by use of a high frequency power introducing means having no capacitance controlling means at the both ends thereof as shown in FIG. 17 (only a matching device being connected to the one end) under the conditions shown in Table 12 in the same manner as in Experiment 1.

FIG. 18 shows the results. The values of the electron temperature were normalized by regarding the highest measurement value as 1. The valley of the electron temperature was observed, showing the nonuniformity of the discharge.

EXPERIMENT 2

A high frequency power introducing means shown in FIG. 9 of the present invention was set in a apparatus shown in FIGS. 8A and 8B. The capacitance of the high frequency power introducing means was adjusted to generate uniform plasma discharge under the conditions shown in Table 13. The electron temperature distribution was measured in the same manner as in Experiment 1.

The results are shown in FIG. 19. In FIG. 19, the values of the electron temperature were normalized by regarding the highest measurement value as 1. As shown in FIG. 19, uniform distribution was obtained without variation.

COMPARATIVE EXPERIMENT 2

Figure 20:
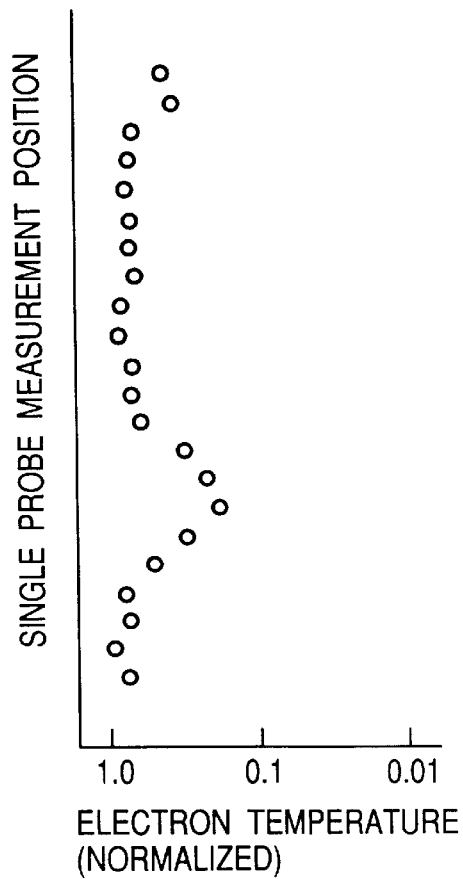

The electron temperature distribution was measured with the same apparatus used in Comparative Experiment 1 under the conditions shown in Table 13 in the same manner as in Experiment 1. FIG. 20 shows the results. The valley of the electron temperature was observed with the conventional apparatus.

The above results of Experiments and Comparative Experiments show that in the apparatus of the present invention, the nonuniformity of the discharge can be reduced by providing a capacitance adjusting means respectively at the both ends of the high frequency power introducing means to control the capacitances to prevent the variation of the discharge conditions. On the other hand, nonuniform discharge is generated in the conventional apparatus for photosensitive member formation. From Comparative Experiments 1 and 2, the state and degree of the nonuniformity of discharge depend on the discharge conditions. Therefore, a conventional apparatus which does not cause nonuniformity of the discharge under certain conditions may cause nonuniformity under different conditions.

EXPERIMENT 3

A high frequency power introducing means shown in FIG. 9 of the present invention was set in a apparatus shown in FIGS. 8A and 8B. Plasma discharge was generated under the conditions shown in Table 14. The frequency of the high frequency power source was varied from 13.56 MHz to 600 MHz. The capacitance of the high frequency power introducing means was adjusted to make the plasma discharge under the respective discharge conditions uniform. The electron temperature distribution was measured in the same manner as in Experiment 1. The results are shown in Table 15.

COMPARATIVE EXPERIMENT 3

The electron temperature distribution was measured with the same apparatus as in Comparative Experiment 1 under the conditions shown in Table 14 at frequencies ranging from 13.56 MHz to 600 MHz in the same manner as in Experiment 1. The results are shown in Table 15.

In Table 15, the nonuniformity of the electron temperature is represented by the ratio of the measured lowest value to the measured highest value of the electron temperature. As shown in Table 15, when the apparatus of the present invention was used, the nonuniformity was less at any of the tested frequency, whereas when the conventional apparatus was used, the nonuniformity tended to be more remarkable at higher frequencies, becoming excessive at frequencies exceeding 50 MHz.

At the frequency of 13.56 MHz under the conditions of Table 14, the discharge could not be generated by the apparatus of Experiment 3 as well as the apparatus of Comparative Experiment 3. At the frequencies of 500 MHz and 600 MHz, the discharge was liable to be interrupted and could not be maintained for a long time when the apparatuses of Experiment 3 and Comparative Experiment 3 were used. Therefore, the power frequency is preferably in the range of from 20 MHz to 450 MHz in view of the discharge stability, more preferably from 50 MHz to 450 MHz for attaining the remarkable effect of the present invention even though the effect can be attained at any power frequency.

EXAMPLE 9

Figure 21:
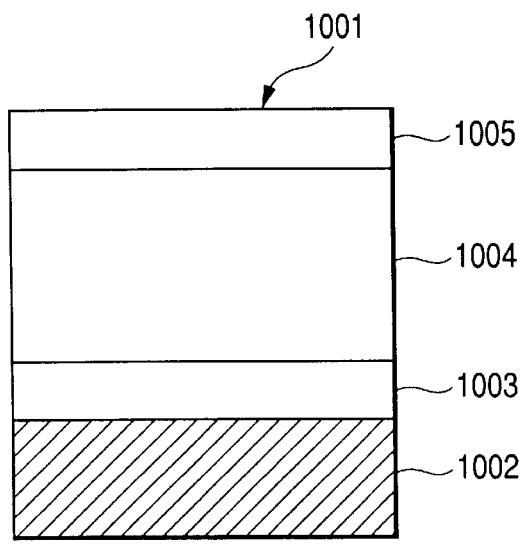
FIG. 21 is a schematic sectional view showing an example of constitution of an electrophotographic photosensitive member.

A high frequency power introducing means shown in FIG. 9 of the present invention was set in a apparatus shown in FIGS. 8A and 8B. By using this apparatus, a photosensitive member 1001 was prepared by forming, on an electroconductive base member 1002, successively a charge injection layer 1003, a photoconductive layer 1004, and a surface layer 1005 as shown in FIG. 21 under the conditions of Table 16. Prior to the film formation, the capacitance at the tip end portion of the electrode was preliminarily determined so as to generate uniform plasma in the same manner as in Experiment 1, and the capacitance was adjusted in every formations of the respective layers by the capacitance adjusting means.

In Table 16, the "layer thickness" signifies an aimed thickness. The conditions of the photoconductive layer formation in Table 16 are the same as the discharge conditions in Experiment 1, and the conditions of the charge injection inhibition layer in Table 16 are the same as the discharge conditions in Comparative Experiment 2 respectively including the conditions for the capacitance adjusting means.

The eight photosensitive members formed simultaneously were evaluated for nonuniformity of the density and coarseness of the formed image by the following methods.

Nonuniformity of Image Density

The photosensitive member was set on an electrophotographic apparatus (NP6750, manufactured by Canon K.K., modified for the test). An intermediate tone chart of Canon K.K. (Par t No.: FY9-9042) was copied by using the apparatus. The image density was measured at randomly selected 50 points on the copied image by means of a reflection densitometer. The ratio of the reflection intensity of the lowest image density portion to that of highest image density portion was derived for each of the photosensitive members. The ratios were derived respectively for the eight photosensitive member prepared simultaneously, and were averaged to represent the nonuniformity of the image density.

Image Coarseness

The photosensitive member was set on an electrophotographic apparatus (NP6750, manufactured by Canon K.K., modified for the test). An intermediate tone chart of Canon K.K. (Part No.: FY9-9042) was copied by using the apparatus, and the copied image was examined visually. The absence level of coarseness was represented as below:

⊚: Excellent

○: Good

Δ: No problem in practical use

×: Requirements in practical use being not sufficiently satisfied.

The results are shown in Table 17.

COMPARATIVE EXAMPLE 3

Photosensitive members were prepared in the same manner as in Example 9 except that the conventional apparatus in Comparative Experiment 1 was used. This Comparative Example is equivalent to photosensitive member preparation by using a conventional apparatus without the capacitance optimized at the both ends of the electrode to prevent the nonuniformity of the plasma discharge. The nonuniformity of the image density and the coarseness of the image of the eight photosensitive members were evaluated in the same manner as in Example 9. The results are shown in Table 17.

In Table 17, nonuniformity of the image density is shown by a relative value by regarding the value of Example 9 as 1.0. As shown in Table 17, the results of Example 9 using the apparatus of the present invention were satisfactory. In Comparative Example 3, the image density was nonuniform owing to the nonuniformity of the plasma discharge in the photoconductive layer formation, and image coarseness was generated in the nonuniform density portions of the image.

EXAMPLE 10

A high frequency power introducing means shown in FIG. 10 of the present invention was set in a apparatus shown in FIGS. 8A and 8B. By using this apparatus, a photosensitive member having the constitution shown in FIG. 21 was prepared under the conditions of Table 18. The capacitance at the tip end portion of the electrode was preliminarily determined so as to generate uniform plasma in the same manner as in Experiment 1, and the capacitance was adjusted in each formation of the respective layers.

In Table 18, the "layer thickness" signifies an approximate aimed thickness. The prepared eight photosensitive members were evaluated for the nonuniformity and coarseness of the obtained image in the same manner as in Example 1. The results are shown in Table 20.

EXAMPLE 11

Figure 11A:
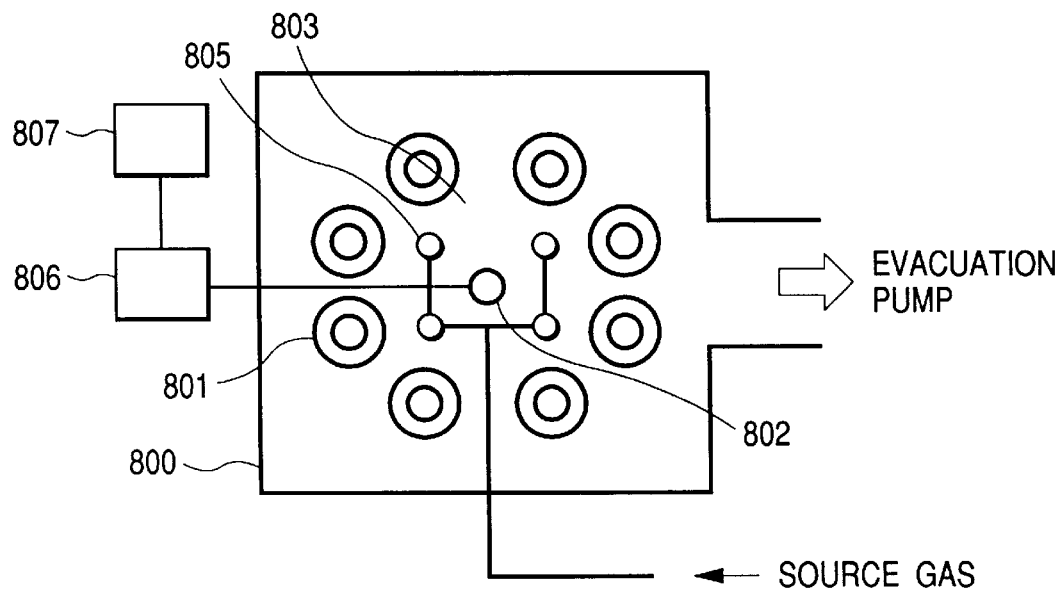
Figure 11B:
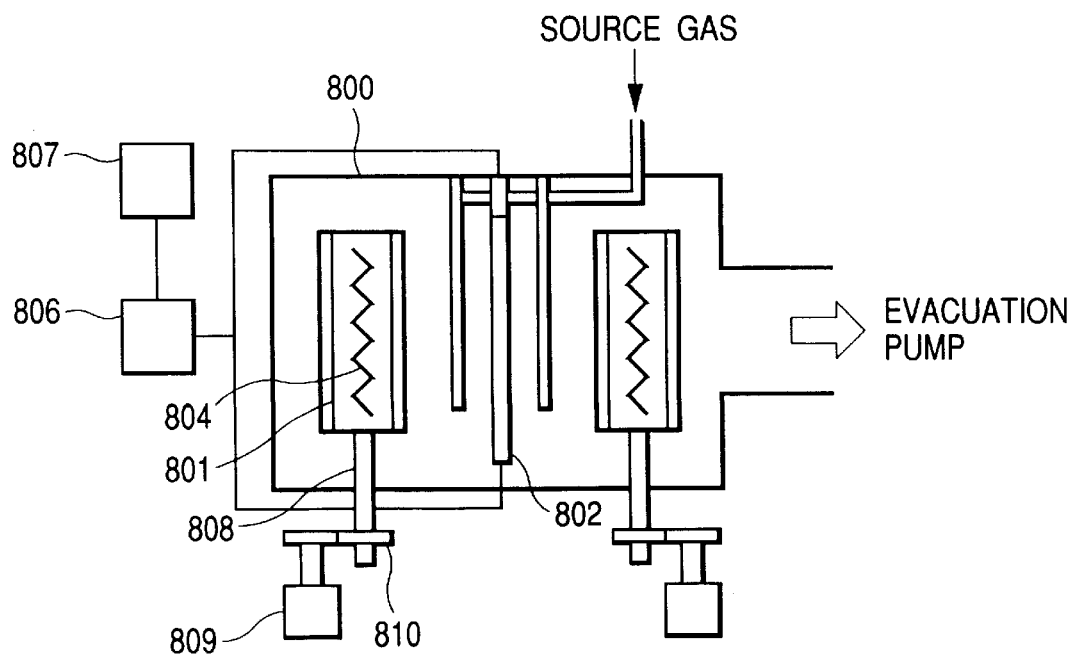

Photosensitive members having layer constitution shown in FIG. 21 were prepared by a deposition film formation apparatus shown in FIGS. 11A and 11B under the conditions of Table 19. The capacitance at the both ends of the electrode was preliminarily determined so as to generate uniform plasma in the same manner as in Experiment 1, and the capacitance was adjusted in each formation of the respective layers.

In Table 19, the "layer thickness" signifies an aimed thickness. The prepared eight photosensitive members were evaluated for the nonuniformity and the coarseness of the image. The results are shown in Table 20. In Table 20, the nonuniformity of image density is shown by a relative value by regarding the value of Example 9 as 1.0. As shown in Table 20, the results with the apparatus of the present invention were satisfactory.

EXAMPLE 12

A high frequency power introducing means shown in FIG. 9 of the present invention was set in a apparatus shown in FIGS. 8A and 8B. By using this apparatus, a photosensitive member was prepared which has a layer constitution shown in FIG. 21. In this Example, the surface of the electrode of the high frequency introducing means was blast-finished, and was represented by Rz with standard length of 2.5 mm. The capacitance at the tip end portion of the electrode was preliminarily determined so as to generate uniform plasma in the same manner as in Experiment 1, and the capacitance was adjusted in each formation of the respective layers.

The temperature of the electrode surface was measured to be about 430° C. during the photoconductive layer formation.

In Table 21, the "layer thickness" signifies an approximate aimed thickness. The prepared photosensitive members were evaluated for the nonuniformity and the coarseness of the obtained image, and peeling of the deposited film from the surface of the high frequency introducing means.

The peeling was evaluated as follows.
Peeling

After formation of the photosensitive member, peeling of the deposition film from the high frequency introducing means was examined visually. The prepared photosensitive member was set in an electrophotography apparatus (NP 6750, manufactured by Canon K.K., modified for testing), and an entire (solid) black image was copied without lighting a halogen lamp for image light exposure. The copied solid black image was examined for emergence of white spots. The peeling was evaluated as below.

⊚: No peeling observed (excellent),

○: Some peeling observed, but the photosensitive member not affected, and increased white spots being not observed on the entire black image (good), Δ: Peeling observed, white spots increased, but no problem in practical use (useful), ×: Peeling observed, white spots increased remarkably, and sometimes not suitable for practical use.

The results are shown in Table 22.

EXAMPLE 13

A photosensitive member was prepared which has a layer constitution shown in FIG. 21 in the same manner as in Example 12 except that the electrode shown in FIG. 9 was covered with an alumina ceramic material. The capacitance at the electrode end portion was again adjusted to the optimum value in each the respective layer formation to offset the capacitance change caused by the influence of the alumina ceramic cover. The surface of the alumina ceramic cover was blast-finished, and was represented by Rz of 25–35 μm with standard length of 2.5 mm.

The resulting photosensitive member was evaluated for uniformity of the image density and the image coarseness in the same manner as in Example 12. The results are shown in Table 22.

EXAMPLE 14

A photosensitive member was prepared which has a layer constitution shown in FIG. 21 in the same manner as in Example 13 except that a cooling mechanism was attached to the high frequency power introducing means of the present invention covered with an alumina ceramic material used in Example 13. The capacitance to be adjusted for uniformity for each of the layers was the same as that in Example 13. The temperature of the surface of the high frequency power introducing means was controlled to be about 200° C. by cooling during the photoconductive layer formation. The resulting photosensitive member was evaluated for the nonuniformity of image density, and peeling. The results are shown in Table 22.

From Table 22, any of the apparatuses of Examples 12 to 14 of the present invention gave satisfactory results. The peeling level of Example 13 was more satisfactory than that of Example 12, although the both levels are represented to be good (○).

EXAMPLE 15

Figure 22A:
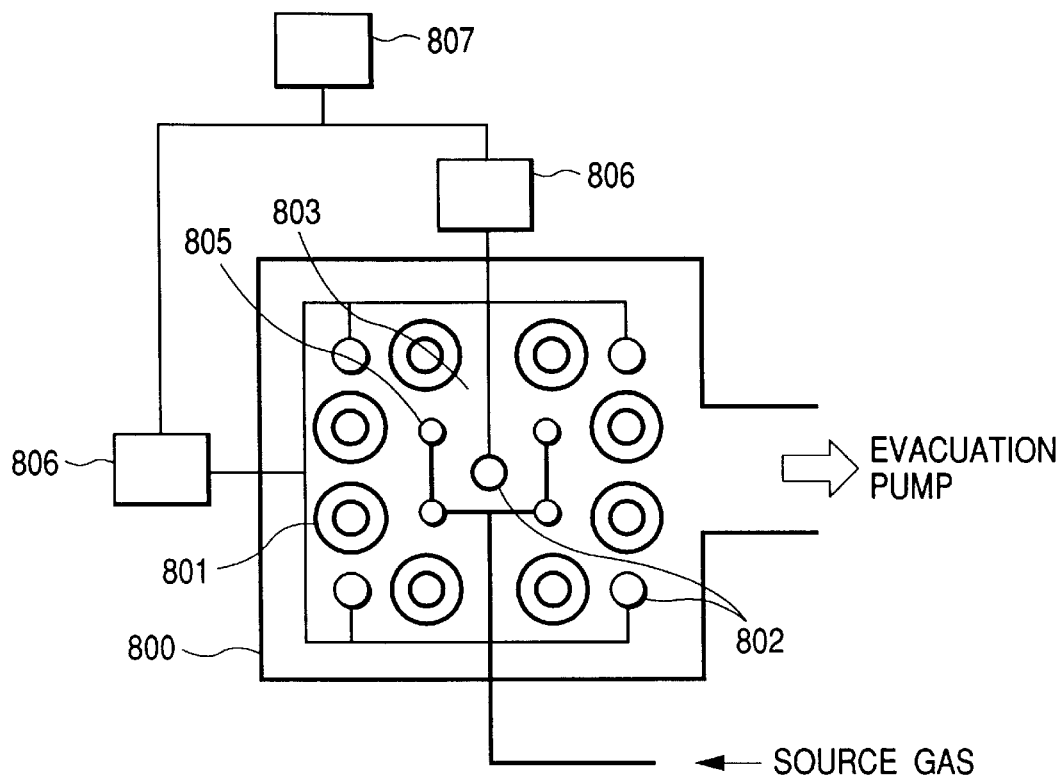
Figure 22B:
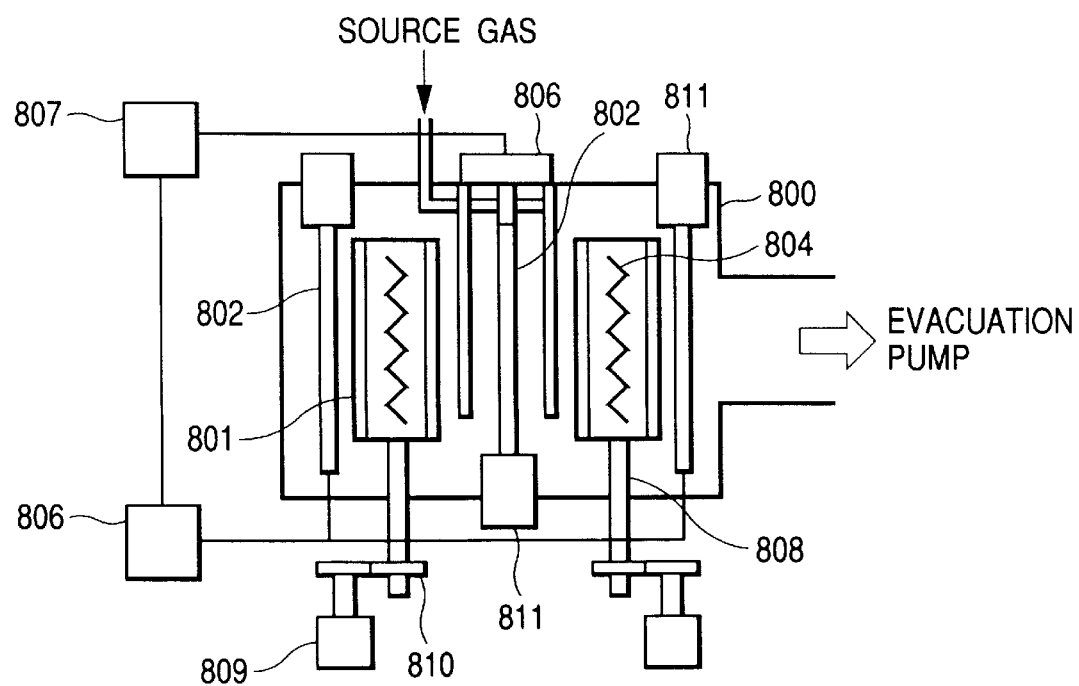

A photosensitive member having a layer constitution shown in FIG. 21 was prepared by means of an apparatus having a plurality of high frequency introducing means of the present invention as shown in FIGS. 22A and 22B under the conditions shown in Table 23. In FIGS. 22A and 22B, one of the high frequency power introducing means 802 was placed at the center of the circular arrangement line of electroconductive base members, and four of the means 802 were placed outside the circular arrangement line along another circular line concentric thereto. The respective high frequency introducing means were connected respectively through a matching device 806 to a high frequency power source 807. The other ends of the high frequency introducing means which are not connected to the matching device 806 are respectively connected to a capacitance adjusting means. The capacitances at the respective tip ends of the electrodes were preliminarily determined so as to generate uniform plasma in the same manner as in Experiment 1, and the capacitances were adjusted thereto in each formation of the respective layers. The four high frequency introducing means placed outside the arrangement circle of the electroconductive base members 801 were adjusted to have the same capacitance.

In Table 23, the "layer thickness" signifies an approximate aimed thickness. The photosensitive member prepared in Example 15 was evaluated for nonuniformity of the image density in the same manner as in Example 9. The results were satisfactory.

As described above, in the present invention, the radiation of high frequency power can be made uniform by adjusting or varying the capacitance at one or both ends of a high frequency power introducing means to prevent localization of plasma, whereby occurrence of nonuniformity of the image density is prevented, and a photosensitive member is efficiently produced with high quality at a low cost. In particular, the present invention can provide an apparatus and a method for forming an electrographic photosensitive member having excellent uniformity and fineness in half tone.

In the present invention, in constructing an electrode, the absolute value of reactance between the tip end of the electrode opposite to the power supplying point of the high frequency electrode for plasma generation and the ground is adjusted to be not higher than a certain value to stabilize the discharge. By using the plasma treatment apparatus and the plasma treatment method employing the high frequency power introducing means as described above, a high-quality deposition film can be formed with extremely uniformity of thickness and quality at a high speed on a large-area base member in a desired shape such as a cylinder, a flat plate, and a sheet.

TABLE 4

| | Film formation pressure | | | | | |
|---|---|---|---|---|---|---|
| | 50 mTorr Deposition rate | | 25 mTorr Deposition rate | | 5 mTorr Deposition rate | |
| Power frequency (MHz) | Average (nm/s) | Distribution (%) | Average (nm/s) | Distribution (%) | Average (nm/s) | Distribution (%) |
| 30 | 0.6 | 6 | 0.5 | 6 | * | * |
| 60 | 1.0 | 6 | 0.9 | 5 | 0.8 | 4 |

TABLE 1

Photosensitivity (Film formation pressure: 50 mTorr)

| Power frequency (MHz) | Top (Power in) | | | | | | | ← Middle → | | | | | | | | | Bottom (to LC) |
|---|---|---|---|---|---|---|---|---|---|---|---|---|---|---|---|---|---|
| 30  | Δ | ○ | Δ | ○ | ○ | Δ | Δ | Δ | ○ | Δ | Δ | ○ | Δ | Δ | ○ | ○ | ○ | ○ |
| 60  | ○ | ○ | ○ | ○ | ○ | ○ | ○ | ○ | ○ | ○ | ○ | ○ | ○ | ○ | ○ | ○ | ○ | ○ |
| 100 | ○ | ○ | ○ | ○ | ○ | ○ | ○ | ○ | ○ | ○ | Δ | ○ | ○ | ○ | ○ | ○ | ○ | ○ |
| 200 | ○ | ○ | ○ | ○ | ○ | ○ | ○ | ○ | ○ | ○ | ○ | ○ | ○ | ○ | ○ | ○ | ○ | ○ |
| 300 | ○ | ○ | ○ | ○ | ○ | ○ | Δ | ○ | ○ | ○ | ○ | ○ | ○ | ○ | ○ | ○ | ○ | ○ |
| 400 | Δ | Δ | Δ | Δ | Δ | Δ | Δ | Δ | Δ | Δ | Δ | Δ | Δ | Δ | Δ | Δ | Δ | Δ |
| 500 | Δ | Δ | Δ | Δ | Δ | Δ | Δ | Δ | Δ | Δ | Δ | Δ | Δ | Δ | Δ | Δ | Δ | Δ |
| 600 | Δ | Δ | Δ | Δ | Δ | Δ | Δ | Δ | Δ | Δ | Δ | Δ | Δ | Δ | Δ | Δ | Δ | Δ |

TABLE 2

Photosensitivity (Film formation pressure: 25 mTorr)

| Power frequency (MHz) | Top (Power in) | | | | | | | ← Middle → | | | | | | | | | Bottom (to LC) |
|---|---|---|---|---|---|---|---|---|---|---|---|---|---|---|---|---|---|
| 30  | ○ | ○ | ○ | ○ | ○ | ○ | ○ | ○ | ○ | ○ | ○ | ○ | ○ | ○ | ○ | ○ | ○ | ○ |
| 60  | ○ | ○ | ○ | ○ | ○ | ○ | ○ | ○ | ○ | ○ | ○ | ○ | ○ | ○ | ○ | ○ | ○ | ○ |
| 100 | ○ | ○ | ○ | ○ | ○ | ○ | ○ | ○ | ○ | ○ | ○ | ○ | ○ | ○ | ○ | ○ | ○ | ○ |
| 200 | ○ | ○ | ○ | ○ | ○ | ○ | ○ | ○ | ○ | ○ | ○ | ○ | ○ | ○ | ○ | ○ | ○ | ○ |
| 300 | ○ | ○ | ○ | ○ | ○ | ○ | ○ | ○ | ○ | ○ | ○ | ○ | ○ | ○ | ○ | ○ | ○ | ○ |
| 400 | ○ | ○ | ○ | ○ | ○ | ○ | ○ | ○ | ○ | ○ | ○ | ○ | ○ | ○ | ○ | ○ | ○ | ○ |
| 500 | ○ | ○ | ○ | ○ | ○ | ○ | ○ | ○ | ○ | ○ | ○ | ○ | ○ | ○ | ○ | ○ | ○ | ○ |
| 600 | ○ | ○ | ○ | ○ | ○ | ○ | ○ | ○ | ○ | ○ | ○ | ○ | ○ | ○ | ○ | ○ | ○ | ○ |

TABLE 3

Photosensitivity (Film formation pressure: 5 mTorr)

| Power frequency (MHz) | Top (Power in) | | | | | | | ← Middle → | | | | | | | | | Bottom (to LC) |
|---|---|---|---|---|---|---|---|---|---|---|---|---|---|---|---|---|---|
| 30  | * | * | * | * | * | * | * | * | * | * | * | * | * | * | * | * | * | * |
| 60  | ◉ | ◉ | ◉ | ◉ | ◉ | ◉ | ◉ | ◉ | ◉ | ◉ | ◉ | ◉ | ◉ | ◉ | ◉ | ◉ | ◉ | ◉ |
| 100 | ◉ | ◉ | ◉ | ◉ | ◉ | ◉ | ◉ | ◉ | ◉ | ◉ | ◉ | ◉ | ◉ | ◉ | ◉ | ◉ | ◉ | ◉ |
| 200 | ◉ | ◉ | ◉ | ◉ | ◉ | ◉ | ◉ | ◉ | ◉ | ◉ | ◉ | ◉ | ◉ | ◉ | ◉ | ◉ | ◉ | ◉ |
| 300 | ◉ | ◉ | ◉ | ◉ | ◉ | ◉ | ◉ | ◉ | ◉ | ◉ | ◉ | ◉ | ◉ | ◉ | ◉ | ◉ | ◉ | ◉ |
| 400 | ○ | ○ | ○ | ○ | ○ | ○ | ○ | ○ | ○ | ○ | ○ | ○ | ○ | ○ | ○ | ○ | ○ | ○ |
| 500 | ○ | ○ | ○ | ○ | ○ | ○ | ○ | ○ | ○ | ○ | ○ | ○ | ○ | ○ | ○ | ○ | ○ | ○ |
| 600 | ○ | ○ | ○ | ○ | ○ | ○ | ○ | ○ | ○ | ○ | ○ | ○ | ○ | ○ | ○ | ○ | ○ | ○ |

* No discharge occurred, Evaluation impossible

TABLE 4-continued

| | Film formation pressure | | | | | |
|---|---|---|---|---|---|---|
| | 50 mTorr Deposition rate | | 25 mTorr Deposition rate | | 5 mTorr Deposition rate | |
| Power frequency (MHz) | Average (nm/s) | Distribution (%) | Average (nm/s) | Distribution (%) | Average (nm/s) | Distribution (%) |
| 100 | 1.6 | 5 | 1.7 | 4 | 1.6 | 4 |
| 200 | 1.8 | 5 | 2.0 | 4 | 1.7 | 4 |
| 300 | 1.6 | 4 | 1.5 | 4 | 1.4 | 4 |
| 400 | 0.7 | 6 | 0.7 | 6 | 0.7 | 6 |
| 500 | 0.7 | 7 | 0.7 | 7 | 0.6 | 7 |
| 600 | 0.6 | 8 | 0.6 | 7 | 0.5 | 7 |

*No discharge occurred, Evaluation impossible

TABLE 5

| | High frequency power (KW) | $SiH_4$ gas flow rate (sccm) | Film formation pressure (mTorr) | Base member temperature (° C.) | Power frequency (MHz) |
|---|---|---|---|---|---|
| Example | | | | | |
| 1 | 1.0 | 500 | 5, 25, 50 | 250 | 30–600 |
| 3 | 0.8* | 1500 | 8 | 200 | 100 |
| 5 | 0.8* | 1500 | 8 | 200 | 100 |
| 7 | 0.5* | 400 | 15 | 300 | 250 |
| 8 | 1.0 | 500 | 10 | 250 | 550 |
| Comparative Example | | | | | |
| 1 | 1.0 | 500 | 5, 25, 50 | 250 | 13.56–650 |
| 2 | 2.0 | 400 | 15 | 300 | 250 |

*Power per one electrode

TABLE 6

| Electrophotographic photosensitive member layer | Film formation conditions |
|---|---|
| Surface protection layer | |
| $SiH_4$ gas flow rate: | 100 sccm |
| $H_2$ gas flow rate: | 100 sccm |
| $CH_4$ gas flow rate: | 500 sccm |
| Input power: | 800 W |
| Reaction pressure: | 5 mTorr |
| Layer thickness: | 1 μm |
| Photoconductive layer | |
| $SiH_4$ gas flow rate: | 400 sccm |
| $H_2$ gas flow rate: | 400 sccm |
| Input power: | 1000 W |
| Reaction pressure: | 5 mTorr |
| Layer thickness: | 25 μm |
| Charge injection inhibition layer | |
| $SiH_4$ gas flow rate: | 400 sccm |
| $H_2$ gas flow rate: | 400 sccm |
| NO gas flow rate: | 500 sccm |
| $B_2H_6$ gas flow rate: | 2000 ppm (based on $SiH_4$ flow rate) |
| Input power: | 800 W |
| Reaction pressure: | 5 mTorr |
| Layer thickness: | 1 μm |

TABLE 7

| Electrophotographic photosensitive member layer | Film formation conditions |
|---|---|
| Surface protection layer | |
| $SiH_4$ gas flow rate: | 300 sccm |
| $H_2$ gas flow rate: | 300 sccm |
| $CH_4$ gas flow rate: | 1500 sccm |
| Input power: | 500 W (per electrode) |
| Reaction pressure: | 5 mTorr |
| Layer thickness: | 1 μm |
| Photoconductive layer | |
| $SiH_4$ gas flow rate: | 1500 sccm |

TABLE 7-continued

| Electrophotographic photosensitive member layer | Film formation conditions |
|---|---|
| $H_2$ gas flow rate: | 1500 sccm |
| Input power: | 800 W (per electrode) |
| Reaction pressure: | 5 mTorr |
| Layer thickness: | 25 μm |
| Charge injection inhibition layer | |
| $SiH_4$ gas flow rate: | 1000 sccm |
| $H_2$ gas flow rate: | 1000 sccm |
| NO gas flow rate: | 1200 sccm |
| $B_2H_6$ gas flow rate: | 2000 ppm (based on $SiH_4$ flow rate) |
| Input power: | 500 W (per electrode) |
| Reaction pressure: | 5 mTorr |
| Layer thickness: | 1 μm |

TABLE 8

Photosensitivity (Film formation pressure: 50 mTorr)

| Power frequency (MHz) | Top (Power in) | | | | | | ← Middle → | | | | | | | | | | Bottom (to LC) |
|---|---|---|---|---|---|---|---|---|---|---|---|---|---|---|---|---|---|
| 13.56 | Δ | ○ | Δ | ○ | ○ | Δ | ○ | ○ | ○ | ○ | ○ | Δ | Δ | ○ | ○ | Δ | ○ | Δ |
| 30 | ○ | Δ | X | X | Δ | ○ | ○ | Δ | Δ | ○ | Δ | ○ | Δ | ○ | ○ | Δ | ○ | Δ |
| 60 | ○ | ○ | Δ | X | X | X | Δ | ○ | ○ | ○ | ○ | ○ | ○ | ○ | ○ | ○ | ○ | ○ |
| 100 | ○ | ○ | ○ | ○ | ○ | Δ | X | X | X | X | ○ | ○ | ○ | ○ | ○ | ○ | ○ | ○ |
| 200 | ○ | ○ | ○ | ○ | ○ | ○ | ○ | ○ | X | X | X | X | Δ | ○ | ○ | ○ | ○ | ○ |
| 300 | ○ | ○ | ○ | ○ | ○ | ○ | ○ | ○ | ○ | X | X | X | X | Δ | ○ | ○ | ○ | ○ |
| 400 | Δ | Δ | X | X | Δ | Δ | Δ | Δ | Δ | Δ | X | X | X | Δ | Δ | Δ | Δ | |
| 500 | Δ | Δ | Δ | X | X | X | Δ | Δ | Δ | Δ | Δ | X | X | X | Δ | Δ | Δ | |
| 600 | Δ | X | Δ | Δ | Δ | X | X | X | Δ | Δ | Δ | Δ | X | X | X | Δ | Δ | |
| 650 | * | * | * | * | * | * | * | * | * | * | * | * | * | * | * | * | * | * |

*No discharge occurred, Evaluation impossible

TABLE 9

Photosensitivity (Film formation pressure: 25 mTorr)

| Power frequency (MHz) | Top (Power in) | | | | | | ← Middle → | | | | | | | | | | Bottom (to LC) |
|---|---|---|---|---|---|---|---|---|---|---|---|---|---|---|---|---|---|
| 13.56 | * | * | * | * | * | * | * | * | * | * | * | * | * | * | * | * | * | * |
| 30 | Δ | Δ | X | X | Δ | Δ | Δ | Δ | Δ | Δ | Δ | Δ | Δ | Δ | Δ | Δ | | |
| 60 | ○ | ○ | Δ | X | X | X | Δ | ○ | ○ | ○ | ○ | ○ | ○ | ○ | ○ | ○ | ○ | |
| 100 | ○ | ○ | ○ | ○ | Δ | Δ | X | X | X | X | Δ | ○ | ○ | ○ | ○ | ○ | ○ | |
| 200 | ○ | ○ | ○ | ○ | ○ | ○ | Δ | X | X | X | X | Δ | ○ | ○ | ○ | ○ | ○ | |
| 300 | ○ | ○ | ○ | ○ | ○ | ○ | ○ | ○ | Δ | X | X | X | X | Δ | ○ | ○ | ○ | |
| 400 | ○ | ○ | Δ | X | X | Δ | ○ | ○ | ○ | Δ | X | X | X | Δ | ○ | ○ | ○ | |
| 500 | ○ | ○ | Δ | Δ | X | X | Δ | ○ | ○ | ○ | ○ | X | X | X | ○ | ○ | ○ | |
| 600 | ○ | X | Δ | ○ | ○ | Δ | X | X | X | Δ | ○ | ○ | ○ | X | X | X | Δ | ○ |
| 650 | * | * | * | * | * | * | * | * | * | * | * | * | * | * | * | * | * | |

*No discharge occurred, Evaluation impossible

TABLE 10

Photosensitivity (Film formation pressure: 5 mTorr)

| Power frequency (MHz) | Top (Power in) | | | | | | ← Middle → | | | | | | | | | | Bottom (to LC) |
|---|---|---|---|---|---|---|---|---|---|---|---|---|---|---|---|---|---|
| 13.56 | * | * | * | * | * | * | * | * | * | * | * | * | * | * | * | * | * | * |
| 30 | * | * | * | * | * | * | * | * | * | * | * | * | * | * | * | * | * | * |
| 60 | ⊙ | ⊙ | ○ | X | X | X | ○ | ⊙ | ⊙ | ⊙ | ⊙ | ⊙ | ⊙ | ⊙ | ⊙ | ⊙ | ⊙ | |
| 100 | ○ | ⊙ | ○ | Δ | X | X | X | X | Δ | ○ | ⊙ | ⊙ | ⊙ | ⊙ | ⊙ | ⊙ | ⊙ | |
| 200 | ⊙ | ⊙ | ⊙ | ⊙ | ⊙ | ⊙ | Δ | X | X | X | X | ○ | ⊙ | ⊙ | ⊙ | ⊙ | ⊙ | |
| 300 | ⊙ | ⊙ | ⊙ | ⊙ | ⊙ | ⊙ | ⊙ | ○ | Δ | X | X | X | Δ | ⊙ | ⊙ | ⊙ | ⊙ | |
| 400 | ○ | ○ | Δ | X | X | Δ | ○ | ○ | ○ | ○ | X | X | X | Δ | Δ | ○ | ○ | |
| 500 | ○ | ○ | Δ | Δ | X | X | Δ | ○ | ○ | ○ | ○ | X | X | X | Δ | ○ | ○ | |
| 600 | ○ | X | X | ○ | ○ | Δ | X | X | X | Δ | ○ | ○ | ○ | X | X | X | Δ | ○ |
| 650 | * | * | * | * | * | * | * | * | * | * | * | * | * | * | * | * | * | |

*No discharge occurred, Evaluation impossible

TABLE 11

Film formation pressure

| Power frequency (MHz) | 50 mTorr Deposition Rate | | 25 mTorr Deposition Rate | | 5 mTorr Deposition Rate | |
|---|---|---|---|---|---|---|
| | Average (nm/s) | Distribution (%) | Average (nm/s) | Distribution (%) | Average (nm/s) | Distribution (%) |
| 13.56 | 0.15 | 10 | * | * | * | * |
| 30 | 0.5 | 20 | 0.4 | 21 | * | * |
| 60 | 1.0 | 21 | 1.1 | 20 | 1.0 | 20 |
| 100 | 1.6 | 25 | 1.7 | 22 | 1.5 | 25 |
| 200 | 1.8 | 28 | 1.9 | 26 | 1.7 | 28 |
| 300 | 1.5 | 28 | 1.4 | 26 | 1.3 | 30 |
| 400 | 0.8 | 35 | 0.9 | 30 | 0.6 | 38 |
| 500 | 0.7 | 38 | 0.7 | 34 | 0.6 | 40 |
| 600 | 0.6 | 40 | 0.6 | 35 | 0.5 | 44 |
| 650 | * | * | * | * | * | * |

* No discharge occurred, Evaluation impossible

TABLE 12

| | |
|---|---|
| Source gas flow rate SiH$_4$ (sccm) | 250 |
| Base member temperature (° C.) | 250 |
| Internal pressure (Pa) | 2 |
| High frequency power (W) | 500 |
| High frequency (MHz) | 105 |

TABLE 13

| Source gas flow rate | |
|---|---|
| SiH$_4$ (sccm) | 150 |
| B$_2$H$_6$ (ppm, based on SiH$_4$) | 1000 |
| NO (sccm) | 8 |
| Base member temperature (° C.) | 250 |
| Internal pressure (Pa) | 1.5 |
| High frequency power (W) | 500 |
| High frequency (MHz) | 105 |

TABLE 14

| | |
|---|---|
| Source gas flow rate SiH$_4$ (sccm) | 500 |
| Base member temperature (° C.) | 300 |
| Internal pressure (Pa) | 4 |
| High frequency power (W) | 1000 |
| High frequency (MHz) | Varied |

TABLE 15

Nonuniformity of electron temperature

| | Frequency (MHz) | | | | | | | |
|---|---|---|---|---|---|---|---|---|
| | 13.56 | 20 | 50 | 105 | 250 | 450 | 500 | 600 |
| Experiment 3 | 0.92 | 0.91 | 0.91 | 0.93 | 0.89 | 0.89 | 0.94 | 0.93 |
| Comparative Experiment 3 | 0.86 | 0.83 | 0.69 | 0.46 | 0.38 | 0.19 | 0.23 | 0.21 |

TABLE 16

| Constituting layer | Charge injection inhibition layer | Photo-conductive layer | Surface layer |
|---|---|---|---|
| Source gas flow rate | | | |
| SiH$_4$ (sccm) | 150 | 250 | 20 |
| B$_2$H$_6$ (ppm, based on SiH$_4$) | 1000 | | |
| CH$_4$ (sccm) | | | 200 |
| NO (sccm) | 8 | | |
| Base member temperature (° C.) | 250 | 250 | 210 |
| Internal pressure (Pa) | 1.5 | 2 | 2 |
| High frequency power (W) | 500 | 500 | 150 |
| Layer thickness (μm) | 3 | 25 | 0.5 |

TABLE 17

| | Example 9 | Comparative Example 3 |
|---|---|---|
| Image density nonuniformity | 1.0 | 0.78 |
| Image coarseness | ⊚ | Δ |

TABLE 18

| Constituting layer | Charge injection inhibition layer | Photo-conductive layer | Surface layer |
|---|---|---|---|
| Source gas flow rate | | | |
| SiH$_4$ (sccm) | 300 | 300 | 80 |
| H$_2$ (sccm) | | | |
| B$_2$H$_6$ (ppm, based on SiH$_4$) | 300 | 0.1 | |
| CH$_4$ (sccm) | | | 600 |
| Base member temperature (° C.) | 250 | 250 | 250 |
| Internal pressure (Pa) | 1 | 1 | 1 |
| High frequency power (W) (105 MHz) | 2000 | 2000 | 600 |
| Layer thickness (μm) | 2 | 15 | 0.5 |

TABLE 19

| Constituting layer | Charge injection inhibition layer | Photo-conductive layer | Surface layer |
|---|---|---|---|
| Source gas flow rate | | | |
| SiH$_4$ (sccm) | 300 | 300 | 300 |
| H$_2$ (sccm) | | | |
| B$_2$H$_6$ (ppm, based on SiH$_4$) | 1000 | 3 | |
| CH$_4$ (sccm) | | | 1000 |
| NO (sccm) | 15 | | |
| Base member temperature (° C.) | 230 | 230 | 250 |
| Internal pressure (Pa) | 3 | 3 | 2 |
| High frequency power (W) (105 MHz) | 3000 | 5000 | 1800 |
| Layer thickness (μm) | 2 | 20 | 0.5 |

TABLE 20

| | Example 10 | Example 11 |
|---|---|---|
| Image density nonuniformity | 0.97 | 1.04 |
| Image coarseness | ⊚ | ⊚ |

TABLE 21

| Constituting layer | Charge injection inhibition layer | Photo-conductive layer | Surface layer |
|---|---|---|---|
| Source gas flow rate | | | |
| SiH$_4$ (sccm) | 300 | 300 | 300 |
| H$_2$ (sccm) | | | |
| B$_2$H$_6$ (ppm, based on SiH$_4$) | 1000 | 3 | |
| CH$_4$ (sccm) | | | 1000 |
| Base member temperature (° C.) | 350 | 350 | 350 |
| Internal pressure (Pa) | 3 | 3 | 2 |
| High frequency power (W) (105 MHz) | 3000 | 5000 | 1800 |
| Layer thickness (μm) | 2 | 20 | 0.5 |

TABLE 22

| | Example 12 | Example 13 | Example 14 |
|---|---|---|---|
| Image density nonuniformity | 1.05 | 0.96 | 0.98 |
| Image coarseness | ⊚ | ⊚ | ⊚ |
| Peeling | ○ | ○ | ⊚ |

TABLE 23

| Constituting layer | Charge injection inhibition layer | Photo-conductive layer | Surface layer |
|---|---|---|---|
| Source gas flow rate | | | |
| SiH$_4$ (sccm) | 350 | 500 | 100 |
| H$_2$ (sccm) | | | |
| B$_2$H$_6$ (ppm, based on SiH$_4$) | 1000 | 3 | |
| CH$_4$ (sccm) | | | 1000 |
| Base member temperature (° C.) | 280 | 280 | 280 |
| Internal pressure (Pa) | 0.5 | 0.5 | 0.5 |
| High frequency power (W) (105 MHz) | 1800 | 3000 | 600 |
| Layer thickness (μm) | 2 | 30 | 0.5 |

What is claimed is:

1. A high frequency power introducing means comprising a high frequency electrode having a bar or plate shape for generating plasma by high frequency power, and an adjustment mechanism for adjusting a value of reactance between an end of the electrode opposite to a power introducing point of the electrode and a grounded portion, wherein the adjustment mechanism is provided between the end of the electrode and the grounded portion.

2. The high frequency power introducing means according to claim 1, wherein the absolute value of the reactance is 50Ω or less at a frequency of the high frequency power.

3. The high frequency power introducing means according to claim 1, wherein the mechanism comprises means for adjusting the reactance by selecting the length of a line to the ground and/or a capacitance of a condenser.

4. The high frequency power introducing means according to claim 1, wherein the surface of the electrode is covered with a dielectric material.

5. The high frequency power introducing means according to claim 1, wherein a power source is further provided for supplying the high frequency power of a frequency ranging from 20 to 600 MHz.

6. The high frequency power introducing means according to claim 1, wherein a power source is further provided for supplying the high frequency power of a frequency ranging from 60 to 300 MHz.

7. A plasma treatment apparatus comprising a vacuum tight reaction chamber, a gas feeding means for feeding a gas to the reaction chamber, a high frequency electrode and a high frequency power source for supplying high frequency power to the reaction chamber, a base member holding means provided in the reaction chamber, and an evacuating means for evacuating a gas within the reaction chamber after reaction, in which a high frequency power generated at the high frequency power source is supplied to the high frequency electrode to generate plasma between the base member held by the base member holding means and the high frequency electrode, wherein an adjustment mechanism is provided for adjusting a value of reactance between an end portion of the electrode opposite to a power introducing point of the electrode and a grounded portion, wherein the adjustment mechanism is provided between the end of the electrode and the grounded portion.

8. The plasma treatment apparatus according to claim 7, wherein the absolute value of the reactance is 50Ω or less at a frequency of the high frequency power.

9. The plasma treatment apparatus according to claim 7, wherein the mechanism comprises means for adjusting the reactance by selecting the length of a line to the ground and/or a capacitance of a condenser.

10. The plasma treatment apparatus according to claim 7, wherein the surface of the electrode is covered by a dielectric material.

11. The plasma treatment apparatus according to claim 7, wherein the power source supplies high frequency power of a frequency ranging from 20 to 600 MHz.

12. The plasma treatment apparatus according to claim 7, wherein the power source supplies high frequency power of a frequency ranging from 60 to 300 MHz.

13. The plasma treatment apparatus according to claim 7, wherein the base member holding means are arranged such that cylindrical base members form a circle line concentric to the high frequency electrode.

14. The plasma treatment apparatus according to claim 7, wherein the high frequency electrode is provided in plural.

15. The plasma treatment apparatus according to claim 7, wherein the high frequency electrode is arranged in plural such that one of the electrodes is positioned at a center and other electrodes are positioned on a circular line concentric to the one electrode.

16. The plasma treatment apparatus according to claim 7, wherein the high frequency electrode is arranged in plural such that one of the electrodes is positioned at a center and other electrodes are positioned on a circular line concentric to the one electrode, and the base member holding means are arranged on the same or another concentric circular line.

17. The plasma treatment apparatus according to claim 7, wherein the base member-holding means comprises means for delivering a sheet-shaped base member.

18. A plasma treatment apparatus comprising a vacuum-tight reaction chamber, and at least a gas-introducing means for introducing a gas into the reaction chamber, and a high frequency power introducing means provided parallel to a generatrix line of a cylindrical base member in the reaction chamber, in which plasma is generated by causing glow discharge between the high frequency power introducing means and the base member, wherein the high frequency power introducing means comprises means for adjusting capacitance between an end portion of the high frequency power introducing means and a grounded portion.

19. The plasma treatment apparatus according to claim 18, wherein the means for adjusting the capacitance has a constitution that one end of the high frequency power introducing means is connected to a matching device, and the other end of the high frequency power introducing means is grounded through a mechanism for varying capacitance.

20. The plasma treatment apparatus according to claim 18, wherein the means for adjusting the capacitance has a constitution that the both ends of the high frequency power introducing means are connected to one matching device.

21. The plasma treatment apparatus according to claim 18, wherein the cylindrical base member is arranged in plural along a circle line and the high frequency power introducing means is placed at the center of the circle line.

22. The plasma treatment apparatus according to claim 18, wherein the high frequency power introducing means is arranged in plural.

23. The plasma treatment apparatus according to claim 18, wherein the high frequency power introducing means is covered with a dielectric material at least at a side confronting to the plasma.

24. The plasma treatment apparatus according to claim 18, wherein the high frequency power introducing means comprises a cooling mechanism for cooling the high frequency power introducing means.

25. The plasma treatment apparatus according to claim 18, wherein the high frequency power introducing means constitutes at least a portion of the gas introducing means.

26. The plasma treatment apparatus according to claim 25, wherein the high frequency power introducing means comprises a gas releasing hole for releasing the gas.

27. The plasma treatment apparatus according to claim 26, wherein the gas releasing hole communicates with a hollow portion of the high frequency power introducing means.

28. The plasma treatment apparatus according to claim 26, wherein the gas releasing hole communicates with a space between the electrode of the high frequency power introducing means and a dielectric material covering the electrode.

29. A plasma treatment method comprising the steps of introducing a gas into a vacuum-tight reaction vessel, and generating plasma by high frequency power between a base member held by a base member holder and a high frequency electrode placed in the reaction chamber, wherein the plasma is maintained in such a state that a value of reactance between an end of the electrode opposite to a power introducing point of the high frequency electrode and a grounded portion is kept at a predetermined value or less.

30. The plasma treatment method according to claim 29, wherein the absolute value of the reactance is 50Ω or less at a frequency of the high frequency power.

31. The plasma treatment method according to claim 29, wherein the reactance is adjusted by selecting the length of a line to the ground and/or a capacitance of a condenser.

32. The plasma treatment method according to claim 29, wherein a deposition film is formed on the base member by utilizing generation of plasma.

33. The plasma treatment method according to claim 29, wherein the base member is cylindrical, wherein a plurality of cylindrical base members are arranged such that axes thereof are substantially positioned along a circle line with the high frequency electrode placed at the center of the circle line in the reaction chamber, and wherein plasma is generated between the high frequency electrode and the cylindrical base members and a deposition film is formed on surfaces of the cylindrical base members while rotating the members.

34. The plasma treatment method according to claim 29, wherein the base member is cylindrical, wherein the high frequency electrodes is provided in plural around the cylindrical base member, and wherein a deposition film is formed on surfaces of the cylindrical base members by generating plasma between the high frequency electrodes and the cylindrical base member.

35. The plasma treatment method according to claim 34, wherein the deposition film is formed on the surfaces of the cylindrical base member while rotating the member.

36. The plasma treatment method according to claim 29, wherein the base member is a plate base member, one or more high frequency electrodes are arranged parallel to the plate base member, and the deposition film is formed on a surface of the base member by generating plasma between the high frequency electrode and the base member.

37. The plasma treatment method according to claim 29, wherein the base member is a sheet base member capable of delivering from a holding roll and wound by a wind-up roll during film formation, one or more high frequency electrodes are arranged parallel to the sheet base member, and the deposition film is formed on the surface of the base member by generating plasma between the high frequency electrode and the base member.

38. A plasma treating method comprising introducing high frequency power into a vacuum-tight reaction chamber through a high frequency power introducing means placed parallel to a generatrix line of a cylindrical electroconductive base member, and causing glow discharge between the high frequency power introducing means and the base member to generate plasma in the reaction chamber wherein capacitance at an end of the high frequency power introducing means is varied.

39. The plasma treatment method according to claim 38, wherein a frequency of the high frequency power ranges from 20 MHz to 600 MHz.

* * * * *

UNITED STATES PATENT AND TRADEMARK OFFICE
CERTIFICATE OF CORRECTION

PATENT NO. : 6,152,071
DATED : November 28, 2000
INVENTOR(S) : Kazuyoshi Akiyama et al.

It is certified that error appears in the above-identified patent and that said Letters Patent is hereby corrected as shown below:

<u>Title page,</u>
Item [56], References Cited, FOREIGN PATENT DOCUMENTS "54086341 60186849" should read -- 54-86341 60-186849 --.

<u>Column 1,</u>
Line 36, "electrodes the" should read -- electrodes. The --.

<u>Column 2,</u>
Line 60, "pipes 16," should read -- pipes 216, --.

<u>Column 4,</u>
Line 48, "member" should read -- members --.

<u>Column 5,</u>
Line 52, "an" should read -- a --.

<u>Column 7,</u>
Line 2, "the slight differences" should read -- this slight difference --; and
Line 67, "n ode" should read -- node --.

<u>Column 9,</u>
Line 14, "introducting" should read -- introducing --; and
Line 19, "introducing" should read -- introducing --.

<u>Column 10,</u>
Line 67, "introducting" should read -- introducing --.

<u>Column 15,</u>
Line 36, "in stable" should read -- instable --.

UNITED STATES PATENT AND TRADEMARK OFFICE
CERTIFICATE OF CORRECTION

PATENT NO. : 6,152,071
DATED : November 28, 2000
INVENTOR(S) : Kazuyoshi Akiyama et al.

It is certified that error appears in the above-identified patent and that said Letters Patent is hereby corrected as shown below:

Column 16,
Line 2, "the half" should read -- half the --; and
Line 57, "in tended" should read -- intended --.

Column 18,
Line 15, introducting" should read -- introducing --; and
Line 46, "was" should read -- were --.

Column 19,
Line 2, "proper ties" should read -- properties --.

Column 21,
Line 28, "were" should read -- was --; and
Line 47, "silic on" should read -- silicon --.

Column 25,
Line 25, "frequency," should read -- frequencies, --; and
Line 54, "formations" should read -- formation --.

Column 27,
Line 65, "the" should be deleted.

Column 29,
Table 1, "100 ooooooooooΔ" should read -- 100 oooooooooo --; and
Table 1, "300 oooooooΔ" should read -- 300 ooooooo --.

Column 33,
Table 10, "100 o" should read -- 100 oo --.

Column 36,
Table 19, "CH$_4$ (sccm)" should read -- CH$_4$ (sccm)    1000 --; and
Table 19, "NO (sccm) 15    1000" should read -- NO (sccm) 15 --.

UNITED STATES PATENT AND TRADEMARK OFFICE
CERTIFICATE OF CORRECTION

PATENT NO. : 6,152,071
DATED : November 28, 2000
INVENTOR(S) : Kazuyoshi Akiyama et al.

It is certified that error appears in the above-identified patent and that said Letters Patent is hereby corrected as shown below:

Column 37,
Table 22, "Peeling  ◎" should read -- Peeling  ○  ○  ◎ --.

Column 40,
Line 16, "electrodes" should read -- electrode --.

Signed and Sealed this

Fifteenth Day of January, 2002

Attest:

Attesting Officer

JAMES E. ROGAN
Director of the United States Patent and Trademark Office